United States Patent
Ito et al.

(10) Patent No.: US 11,112,464 B2
(45) Date of Patent: Sep. 7, 2021

(54) SIGNAL OUTPUT DEVICE

(71) Applicant: DENSO CORPORATION, Kariya (JP)

(72) Inventors: Takasuke Ito, Kariya (JP); Yoshiyuki Kono, Kariya (JP); Tomoyuki Takiguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/892,791

(22) Filed: Jun. 4, 2020

(65) Prior Publication Data

US 2020/0300922 A1    Sep. 24, 2020

Related U.S. Application Data

(63) Continuation of application No. PCT/JP2018/042482, filed on Nov. 16, 2018.

(30) Foreign Application Priority Data

Dec. 6, 2017    (JP) .............................. JP2017-234417

(51) Int. Cl.
  *G01R 31/40*    (2020.01)
  *G01R 31/52*    (2020.01)
(52) U.S. Cl.
  CPC ............. *G01R 31/40* (2013.01); *G01R 31/52* (2020.01)
(58) Field of Classification Search
  CPC ........ G01R 31/40; G01R 31/52; B60R 16/03; G08C 25/00
  USPC .................................... 324/764.01, 537, 500
  See application file for complete search history.

(56) References Cited

U.S. PATENT DOCUMENTS

| 9,898,631 | B2* | 2/2018 | Wu ..................... G06K 19/0701 |
| 9,906,014 | B2* | 2/2018 | Gao ....................... H02H 3/335 |
| 2006/0050449 | A1 | 3/2006 | Wu |
| 2010/0157487 | A1 | 6/2010 | Wu |
| 2010/0220421 | A1 | 9/2010 | Wu |
| 2011/0128654 | A1 | 6/2011 | Wu |
| 2013/0155562 | A1 | 6/2013 | Kubota et al. |
| 2017/0079112 | A1* | 3/2017 | Lan ....................... H05B 45/48 |

FOREIGN PATENT DOCUMENTS

| CN | 1790885 A | 6/2006 |
| JP | 2009-148043 | 7/2009 |
| JP | 2014-117112 | 6/2014 |
| JP | 2016-86588 | 5/2016 |

* cited by examiner

*Primary Examiner* — Giovanni Astacio-Oquendo
(74) *Attorney, Agent, or Firm* — Nixon & Vanderhye P.C.

(57) ABSTRACT

An output terminal of a signal output device is connected through a branch path to a voltage dividing point in a main path, and transmits an output signal based on a voltage of the voltage dividing point to an outside. A signal generation circuit adjusts the voltage of the voltage dividing point and generates the output signal. A short circuit detection circuit detects a short circuit between the output terminal and another terminal when a current flowing in the branch path is greater than a predetermined short circuit detection threshold. A switching circuit switches a current carrying capacity or a configuration of the signal generation circuit to limit a short circuit current flowing in the branch path when the short circuit is detected. The short circuit current is set to a value equal to or greater than the short circuit detection threshold and less than a current upper limit value.

12 Claims, 20 Drawing Sheets

SHORT CIRCUIT BETWEEN POWER SUPPLY TERMINAL AND OUT TERMINAL

SHORT CIRCUIT BETWEEN OUT TERMINAL AND GND TERMINAL

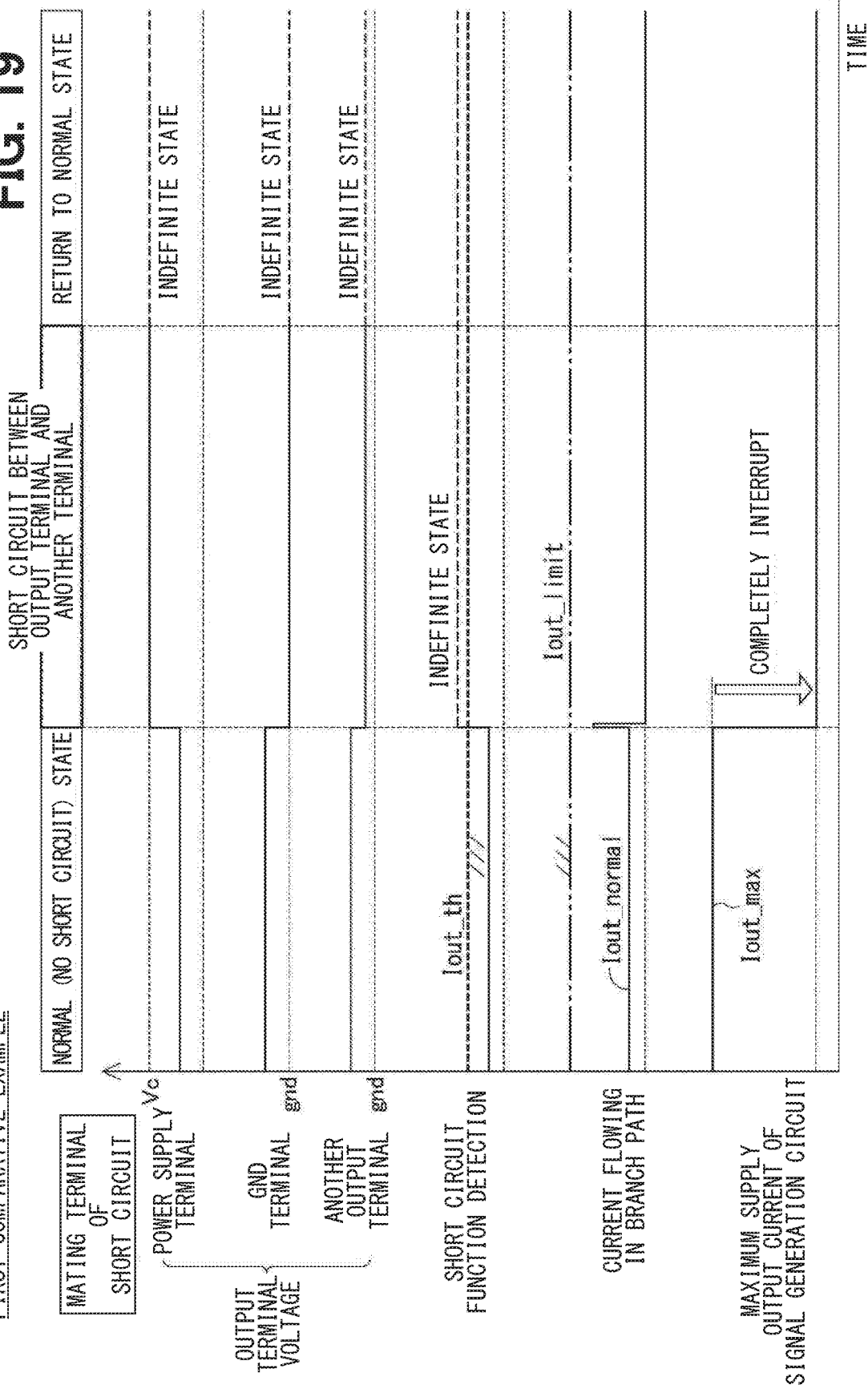

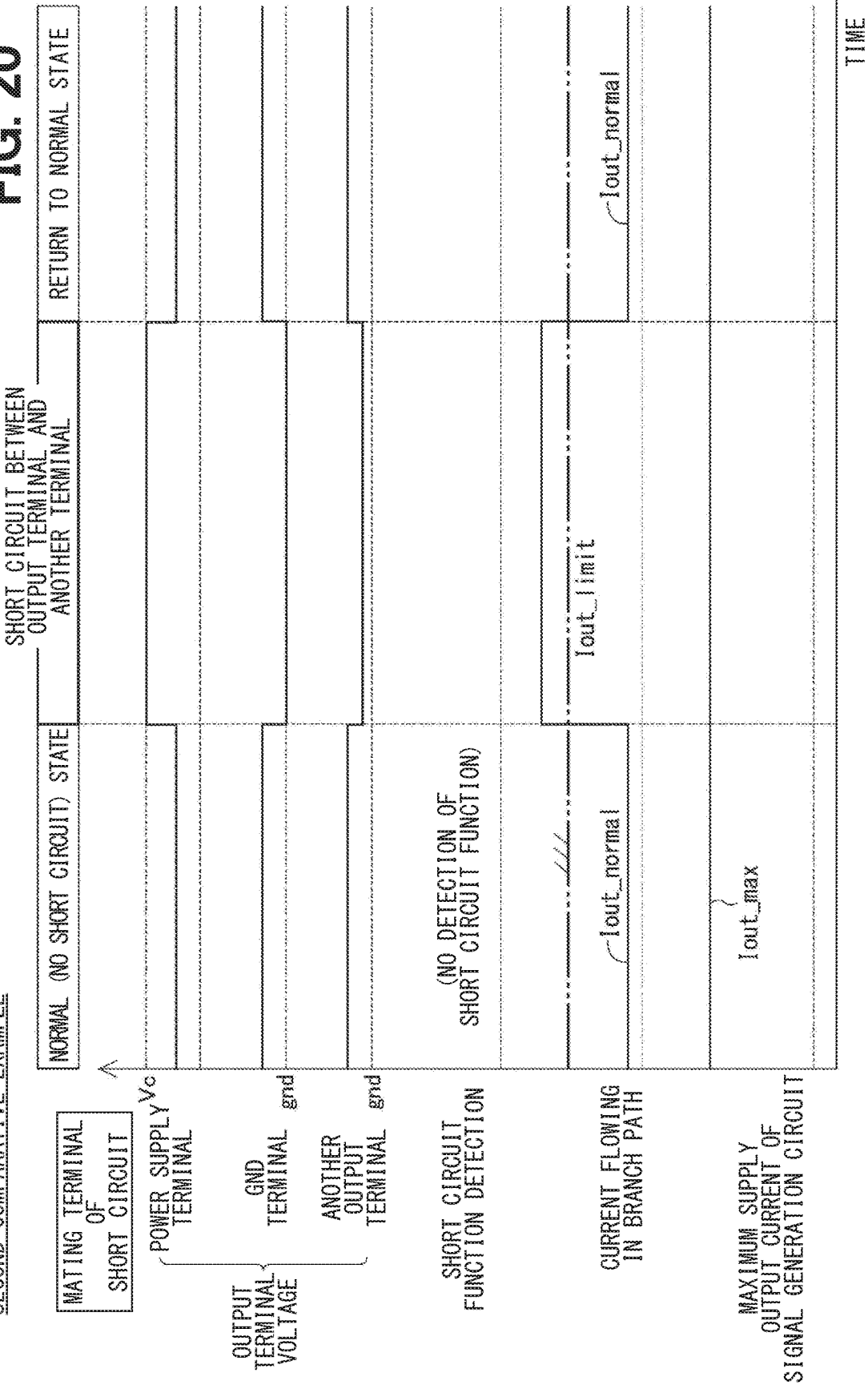

SIGNAL OUTPUT DEVICE

CROSS REFERENCE TO RELATED APPLICATIONS

The present application is a continuation application of International Patent Application No. PCT/JP2018/042482 filed on Nov. 16, 2018, which designated the U.S. and claims the benefit of priority from Japanese Patent Application No. 2017-234417 filed on Dec. 6, 2017. The entire disclosures of all of the above applications are incorporated herein by reference.

TECHNICAL FIELD

The present disclosure relates to a signal output device.

BACKGROUND

Conventionally, a signal output device having an output terminal for outputting a voltage signal has been known.

SUMMARY

The present disclosure provides a signal output device in which an output terminal of a signal output device is connected through a branch path to a voltage dividing point in a main path and transmits an output signal based on a voltage of the voltage dividing point to an outside, a signal generation circuit adjusts the voltage of the voltage dividing point and generates the output signal, a short circuit detection circuit detects a short circuit between the output terminal and another terminal when a current flowing in the branch path is greater than a predetermined short circuit detection threshold, and a switching circuit switches a current carrying capacity or a configuration of the signal generation circuit to limit a short circuit current flowing in the branch path when the short circuit is detected. The short circuit current is set to a value equal to or greater than the short circuit detection threshold and less than a current upper limit value.

BRIEF DESCRIPTION OF DRAWINGS

Objects, features and advantages of the present disclosure will become apparent from the following detailed description made with reference to the accompanying drawings. In the drawings:

FIG. 19 is a time chart showing a change in current during short circuiting between terminals according to a first comparative example; and FIG. 20 is a time chart showing a change in current at the time of short circuiting between terminals according to a second comparative example having no short circuit detection function.

DETAILED DESCRIPTION

Figure 1:
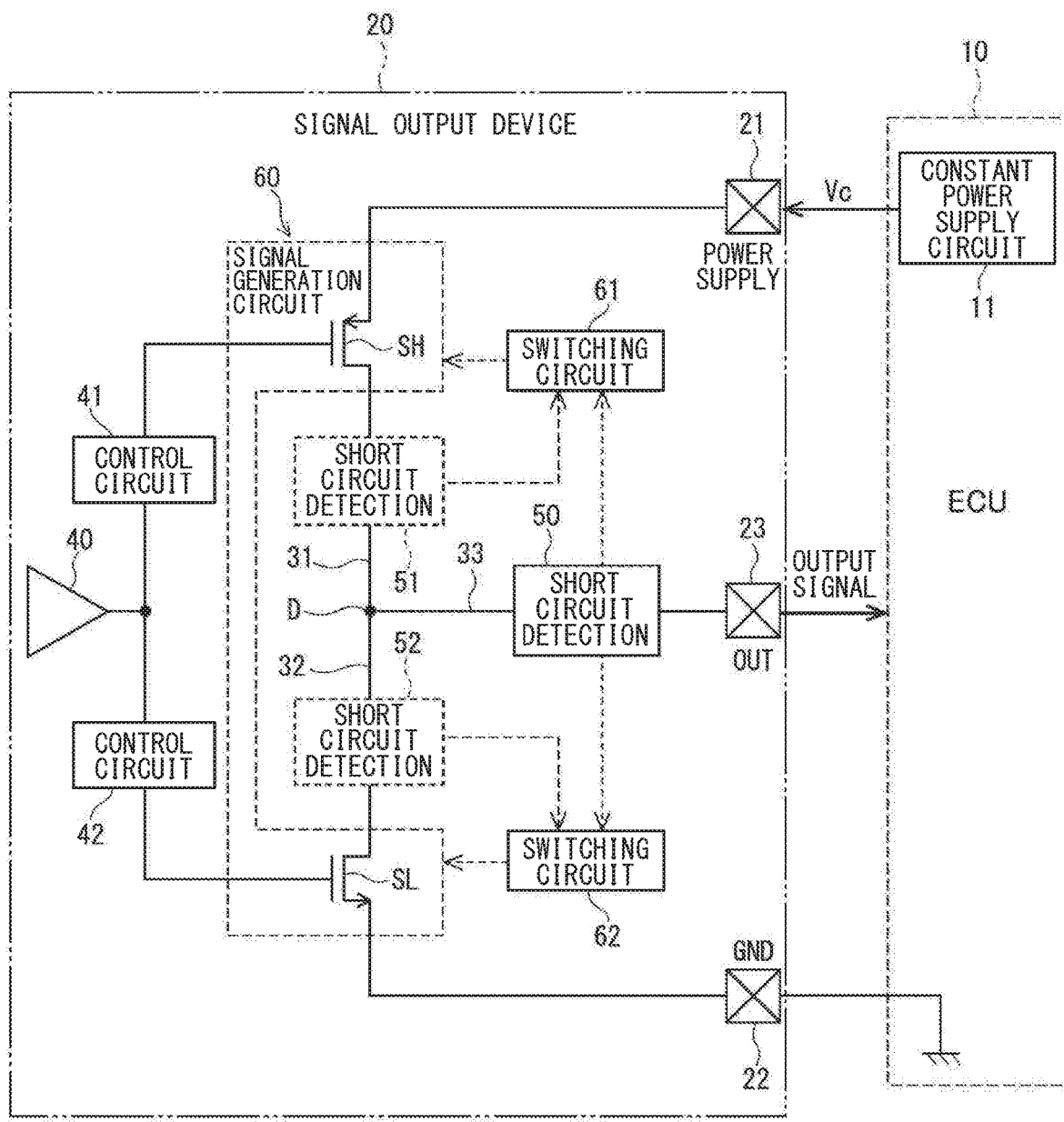
FIG. 1 is a diagram showing a first configuration example of a signal output device according to the present embodiment.

An output circuit of a position detection device according to a first comparative example generates a voltage signal obtained by dividing a voltage between a power supply terminal and a ground terminal based on a detection value of a sensor, and outputs the voltage signal from an output terminal to an external ECU. When the terminals are short-circuited and an abnormal voltage is applied to the output terminal due to a contact of a connector portion with water or metal foreign matter, a contact between wire harnesses of the position detection device, or the like, the output circuit interrupts a current path from a power supply terminal to a ground terminal and protects the circuit.

The short circuit between the terminals due to the contact of waterdrop or the metal foreign matter is temporary so that the terminals return to a normal state if the waterdrop or the foreign matter has been removed. Even when the parts where an insulating coating of the wire harness is peeled off are temporarily in contact with each other due to vibration or the like, if the contact parts are separated from each other, the terminals are restored from a short circuit state. However, in the first comparative example in which the current is completely interrupted, the amount of change in the current cannot be detected when the state returns from the short circuit state to a state of no short circuit, and the return cannot be detected. For example, in a sensor device or the like applied to a system for driving an in-vehicle actuator, even if the in-vehicle network returns to a normal state, the sensor device remains in an abnormal state (or an indefinite state). As a result, even if the short circuit is performed for a short time to such an extent that the system side is not affected, the output cannot be restored, resulting in a problem that the stability of the system cannot be ensured.

A signal output device according to an aspect of the present disclosure includes a power supply terminal configured to be connected to a direct current (DC) power supply, a ground terminal configured to be grounded, an output terminal, a signal generation circuit, a short circuit detection circuit, and a switching circuit.

The output terminal is configured to be connected through a branch path to a voltage dividing point provided in a middle of a main path which is a current path connecting the power supply terminal and the ground terminal, and to transmit an output signal based on a voltage of the voltage dividing point to an outside. The signal generation circuit is configured to adjust the voltage of the voltage dividing point and to generate the output signal.

The short circuit detection circuit is provided on at least one of an upper path which is a path between the power supply terminal and the voltage dividing point in the main path, a lower path which is a path between the voltage dividing point and the ground terminal in the main path, and the branch path. The short circuit detection circuit is configured to detect a short circuit between the output terminal and another terminal when a current flowing in the branch path is greater than a predetermined short circuit detection threshold ($Iout\_th$). The switching circuit is configured to switch a current carrying capacity or a configuration of the signal generation circuit to limit a short circuit current ($Iout\_short$) flowing in the branch path when the short circuit detection circuit detects the short circuit.

The short circuit current is set to a value equal to or greater than the short circuit detection threshold and less than a current upper limit value ($Iout\_limit$) based on a supply capacity of the DC power supply. That is, a setting range of the short circuit current is expressed by the following expression.

$$Iout\_th \le Iout\_short < Iout\_limit$$

As the DC power supply, for example, a power supply circuit for outputting a constant power is used. In that case, the current upper limit value is an upper limit value of the current that can be supplied while the DC power supply maintains a specified output voltage. In other words, if the current is supplied beyond the current upper limit value, a voltage drop occurs, and a critical value which may adversely affect the system corresponds to the upper limit value of the current.

In the present disclosure, when a short circuit occurs between the terminals, the current is limited to a value greater than the current at a normal time and less than the current upper limit value, and then the current flows through the branch path. The short circuit current is limited to be less than the current upper limit value, thereby being capable of preventing the system from being adversely affected. Further, since the current is not completely interrupted as in the first comparative example, the return from the short circuit state to the normal state can be detected. Therefore, the current returns to the normal output immediately after the return detection, thereby being capable of ensuring the stability of the system.

Hereinafter, multiple embodiments of a signal output device will be described with reference to the drawings. In the multiple embodiments, substantially the same components are denoted by the same reference numerals, and a description of the same components will be omitted. The following first to eighth embodiments are collectively referred to as "the present embodiment". A signal output device according to the present embodiment is applied to a system for controlling the operation of an actuator based on a detection value of position information of an in-vehicle actuator such as a throttle valve, an accelerator pedal, or the like, for example. The signal output device generates a voltage signal obtained by dividing a voltage between a power supply terminal and a ground terminal based on a detection value from a sensor, and outputs the voltage signal from an output terminal to an external ECU.

[Overall Configuration of Signal Output Device]

First, a configuration common to each embodiment will be described with reference to FIGS. 1 to 10. A signal output device according to the present embodiment receives a sensor detection signal processed by a DSP (digital signal processor) and outputs the signal as a voltage signal, for example. The signal output device according to the present embodiment may process either an analog signal or a digital signal.

Figure 2:
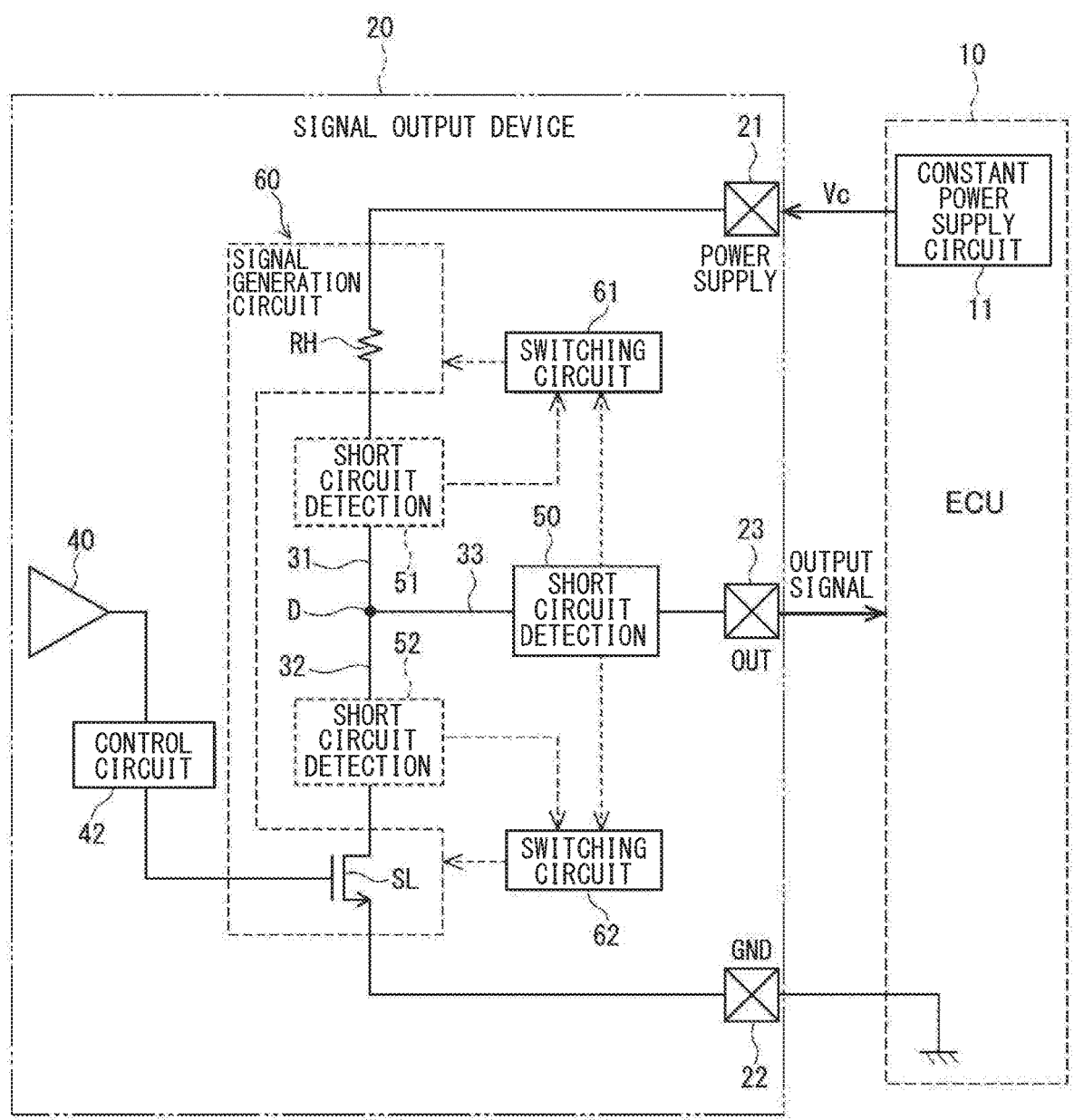
FIG. 2 is a diagram showing a second configuration example of the signal output device according to the present embodiment.
Figure 3A:
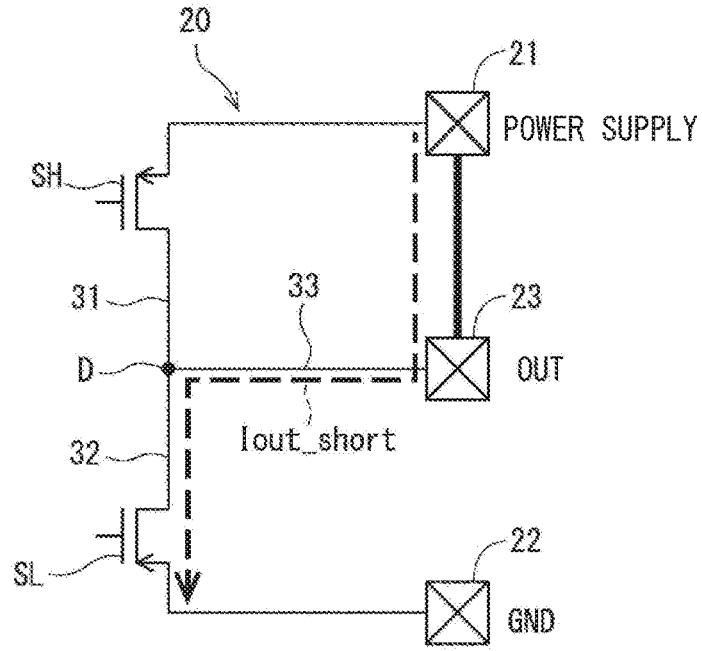
FIG. 3A is a diagram showing a short circuit current path between a power supply terminal and an output terminal.
Figure 3B:
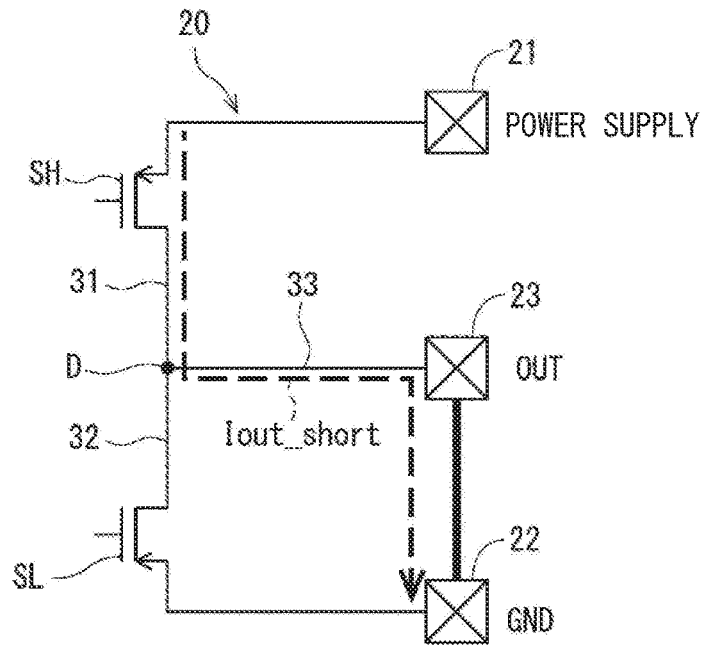
FIG. 3B is a diagram showing a short circuit current path between the output terminal and a ground terminal.

As shown in FIGS. 1 and 2, a signal output device 20 includes a power supply terminal 21, a ground ("GND" in the drawing) terminal 22, an output ("OUT" in the drawing) terminal 23, an input circuit 40, control circuits 41 and 42, a signal generation circuit 60, a short circuit detection circuit 50 (or 51 or 52), and switching circuits 61 and 62. The signal output device 20 is configured as a part of a sensor IC.

Further, as shown in the figure, the output terminal 23 is considered to be disposed between the power supply terminal 21 and the ground terminal 22 in principle, even in a physical placement in an actual product. However, intervals from the output terminal 23 to the power supply terminal 21 and the ground terminal 22 are not necessarily equal to each other. It should be noted that a connection of each element other than the terminal placement is merely illustrated as an electrical connection.

When a short circuit between the output terminal 23 and another terminal is detected, the signal output device 20 according to the present embodiment switches the current carrying capacity or configuration of the signal generation circuit 60 so as to limit a maximum supply output current that can be supplied to the signal generation circuit 60. In this example, the maximum supply output current refers to a maximum current that can be carried in accordance with the characteristics of a switch element or the like configuring the signal generation circuit 60. Hereinafter, "short circuit between terminals" means a short circuit between the output terminal 23 and another adjacent terminal. A state in which the short circuit between terminals is not detected is referred to as a "normal time" and a state in which the terminals are not short-circuited is referred to as a "normal state".

FIG. 1 and FIG. 2 are different from each other in elements configuring the signal generation circuit 60 at the normal time. However, various configuration patterns of the signal generation circuit 60 which are switched at the time of short circuit will be described in detail in the drawings of the respective embodiments described later. For that reason, it is more appropriate to interpret the configurations of the signal generation circuits 60 shown in FIGS. 1 and 2 as basic configuration patterns at the normal time than the two embodiments. Therefore, in FIGS. 1 and 2, the signal generation circuit is illustrated with the symbol "60" that summarizes the respective embodiments.

In the present embodiment, the power supply terminal 21, the ground terminal 22, and the output terminal 23 are connected to an ECU 10, which is a control unit of the system, through harnesses. The power supply terminal 21 is connected to a constant power supply circuit 11 as a DC power supply provided in the ECU 10, and a power supply voltage Vc is supplied to the power supply terminal 21. The constant power supply circuit 11 is a power supply capable of outputting a constant power of, for example, 5 V/20 mA, that is, 0.1 W. The ground terminal 22 is grounded. A voltage dividing point D is provided in the middle of a main path which is a current path connecting the power supply terminal 21 and the ground terminal 22. In the main path, a path between the power supply terminal 21 and a voltage dividing point D is defined as an upper path 31, and a path between the voltage dividing point D and the ground terminal 22 is defined as a lower path 32. The output terminal 23 is connected to the voltage dividing point D through a branch path 33, and transmits an output signal based on the voltage at the voltage dividing point D to an external ECU 10.

The signal generation circuit 60 adjusts the voltage at the voltage dividing point D to generate the output signal. In the configuration example of FIG. 1, the upper path 31 and the lower path 32 are respectively provided with a switch element SH and a switch element SL that can open and close the current path. In the configuration of an analog output, the input circuit 40 is formed of, for example, a buffer amplifier of a negative feedback type. Alternatively, in the configuration of a digital output, the buffer amplifier may not be of a negative feedback type. The control circuits 41 and 42 respectively operate gate voltages of the switch elements SH and SL based on signals of the input circuit 40, and respectively control the currents flowing through the switch elements SH and SL. As a result, the voltage at the voltage dividing point D is adjusted.

In a configuration example of FIG. 2, a resistive element RH is provided in the upper path 31, and a switch element SL is provided in the lower path 32. The control circuit 42 of a low side operates a gate voltage of the switch element SL based on the signal from the input circuit 40, and controls a current flowing through the switch element SL, thereby adjusting the voltage at the voltage dividing point D. The "open drain output" scheme can be used in the configuration of the digital output configuration. The resistance value may be adjusted based on the signal from the input circuit 40 with the resistive element RH of the upper path 31 as a variable resistor. In a system in which high output accuracy and responsiveness are not required, variable resistors may be provided in the upper path 31 and the lower path 32, and the resistance values of the variable resistors may be adjusted based on the signal from the input circuit 40.

In the signal output device 20 described above, when a waterdrop, a metal foreign matter, or the like comes into contact between the adjacent terminals, there is a possibility that a short circuit occurs. For example, as shown in the FIG. 3A, when the power supply terminal 21 and the output terminal 23 are short-circuited, a short circuit current Iout_short from the output terminal 23 toward the voltage dividing point D flows in the lower path 32. When the output terminal 23 and the ground terminal 22 are short-circuited as shown in the FIG. 3B, the short circuit current Iout_short from the voltage dividing point D toward the output terminal 23 flows in the upper path 31.

Figure 4:
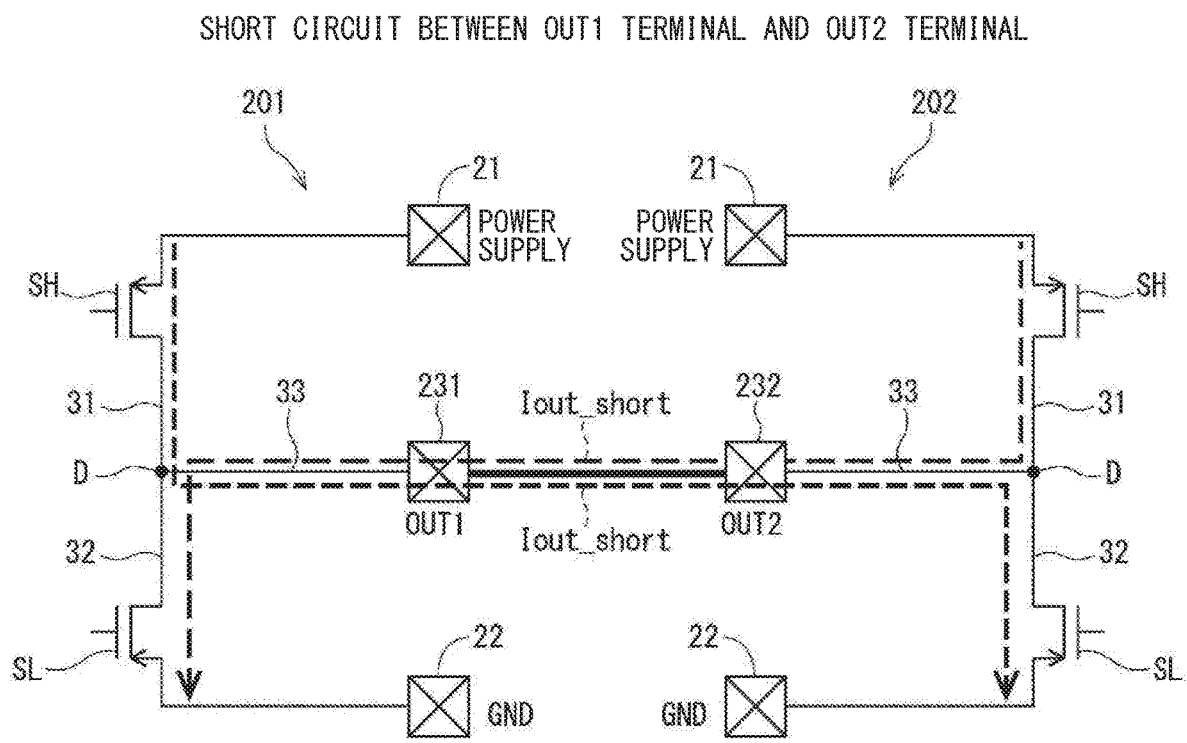
FIG. 4 is a diagram showing a short circuit current path between two output terminals.

Further, for example, in an in-vehicle system, two or more sensor ICs having the same function may be mounted redundantly. As shown in FIG. 4, when the output ("OUT1" in the drawing) terminal 231 and the output ("OUT2" in the drawing) terminal 232 of two signal output devices 201 and 202 are short-circuited, the short circuit current Iout_short flows from the upper path 31 of one signal output device to the lower path 32 of the other signal output device.

In the present embodiment, the short circuit detection circuit 50 for detecting the short circuit current Iout_short is provided, for example, in the middle of the branch path 33. The short circuit detection circuit 50 detects a short circuit between the terminals when the current flowing through the branch path 33 is greater than a predetermined short circuit detection threshold. The short circuit detection circuit 50 can determine which terminals are short-circuited based on the direction of the current. Upon detection of the short circuit, the short circuit detection circuit 50 commands the switching circuits 61 and 62 to limit the maximum supply output current of the signal generation circuit 60.

Alternatively, as indicated by a dashed line block, short circuit detection circuits 51 and 52 may be provided in the upper path 31 and the lower path 32, respectively. In the above configuration, the short circuit detection circuit 51 of the upper path 31 detects a short circuit between the output terminal 23 and the ground terminal 22, and the short circuit detection circuit 52 of the lower path 32 detects a short circuit between the power supply terminal 21 and the output terminal 23. Similarly, upon detection of a short circuit, the short circuit detection circuits 51 and 52 command the switching circuits 61 and 62 to limit the maximum supply output current of the signal generation circuit 60.

Figure 5A:
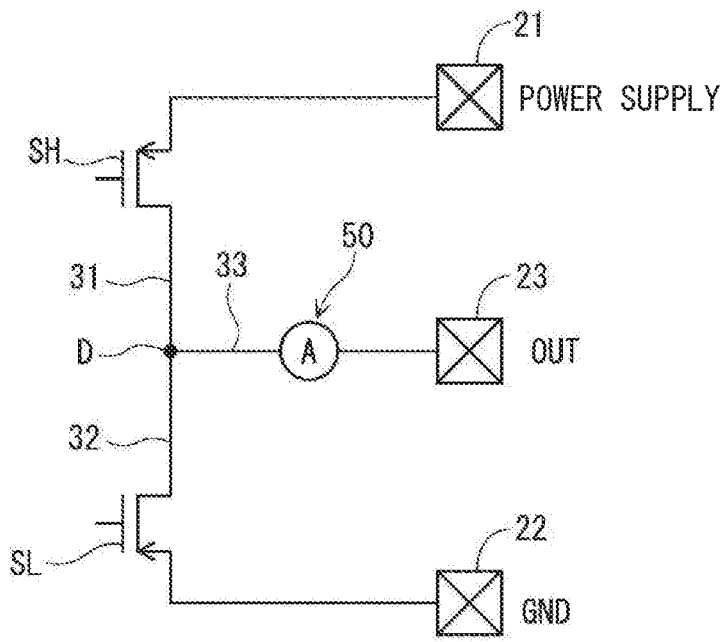
FIG. 5A is a configuration diagram of a short circuit detection circuit for detecting a current in a branch path.
Figure 5B:
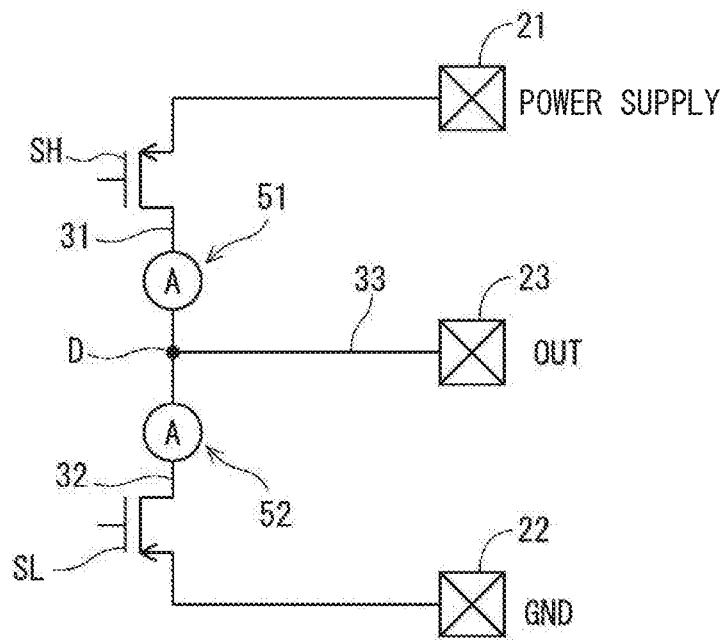
FIG. 5B is a configuration diagram of a short circuit detection circuit for detecting currents in an upper circuit and a lower circuit.
Figure 6A:
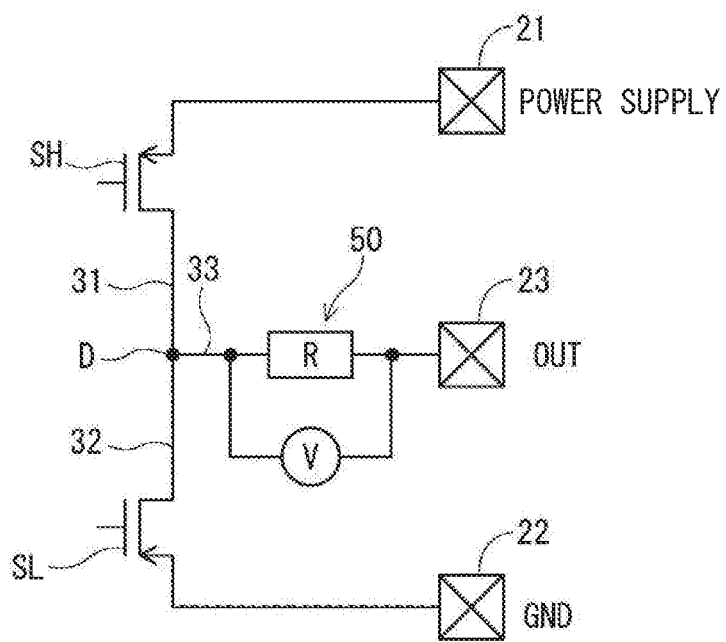
FIG. 6A is a configuration diagram of a short circuit detection circuit for detecting a voltage of the branch path.
Figure 6B:
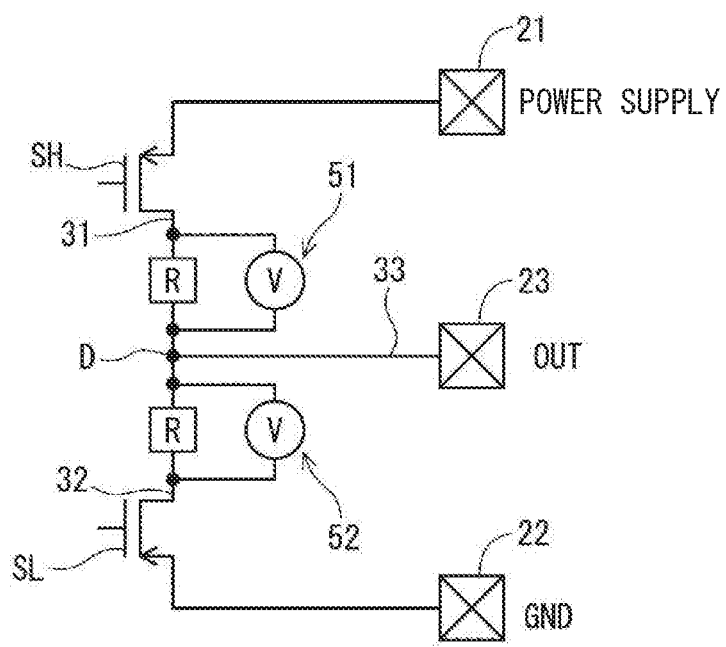
FIG. 6B is a configuration diagram of a short circuit detection circuit for detecting voltages of the upper circuit and the lower circuit.

As shown in FIGS. 5A and 5B, the short circuit detection circuits 50, 51, and 52 may directly detect currents flowing in the branch path 33, the upper path 31, and the lower path 32, respectively. Alternatively, as shown in FIG. 6A and FIG. 6B, each of the short circuit detection circuits 50, 51, and 52 may detect a voltage at both ends of a resistor R (that is, a load) connected to the current path and convert the detected voltage into a current.

Incidentally, a short circuit caused by a waterdrop or a metal foreign matter contacting between the terminals is temporary so that the terminals return to a normal state if the waterdrop or the metal foreign matter is removed. Even when the parts where an insulating coating of the wire harness is peeled off are temporarily in contact with each other due to vibration or the like, if the contact parts are separated from each other, the terminals are restored from a short circuit state. Therefore, in limiting the maximum supply output current of the signal generation circuit 60, the switching circuits 61 and 62 limit the current to such an extent that the short circuit detection circuits 50, 51, and 52 can detect the return when the short circuit state is eliminated. When the short circuit detection circuits 50, 51, and 52 detect that the terminals have returned to the normal state, the short circuit detection circuits 50, 51, and 52 command the switching circuits 61 and 62 to return the maximum supply output current of the signal generation circuit 60 to a value at the normal time.

Further, with reference to FIGS. 7 and 8, a configuration for preventing erroneous detection due to transient signal variation in short circuit detection will be described. Hereinafter, only "50" is represented as a reference numeral of the short circuit detection circuit. For example, the short circuit detection circuit 50 may filter an acquired current or voltage waveform and detect the short circuit based on a filter value from which a high-frequency component has been removed. Alternatively, the short circuit detection circuit 50 may detect the short circuit when a time during which the current or the voltage exceeds the short circuit detection threshold continues for a predetermined time or longer by use of a clock, a counter, or the like.

Figure 7:
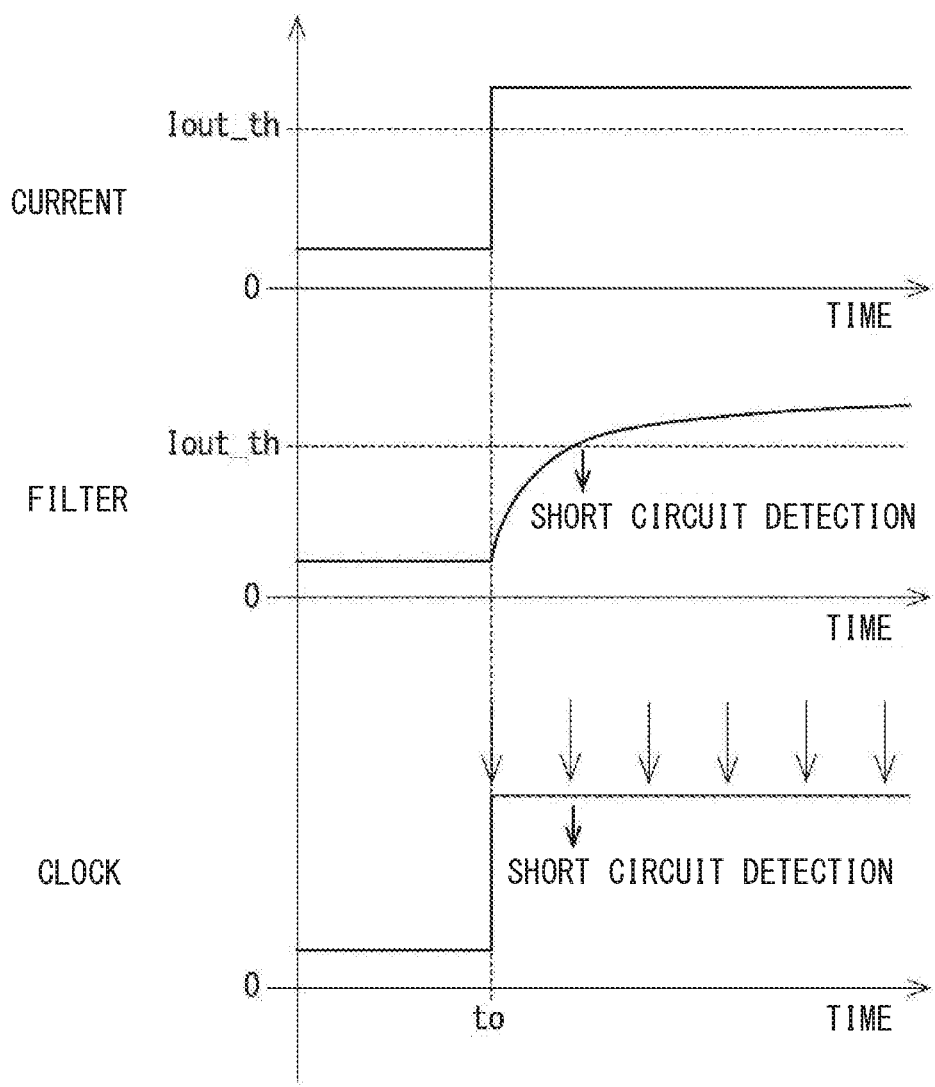
FIG. 7 is a time chart showing a current waveform at the time of short circuiting.

FIG. 7 shows a current waveform obtained by the short circuit detection circuit 50 when a short circuit actually occurs at a time t0, a waveform obtained by filtering the current waveform, and counting of a time of the current variation by use of a clock. In that case, the filtered waveform exceeds a short circuit detection threshold Iout_th, and a short circuit is detected. Further, a count value of the clock reaches a predetermined value, and a short circuit is not detected.

Figure 8:
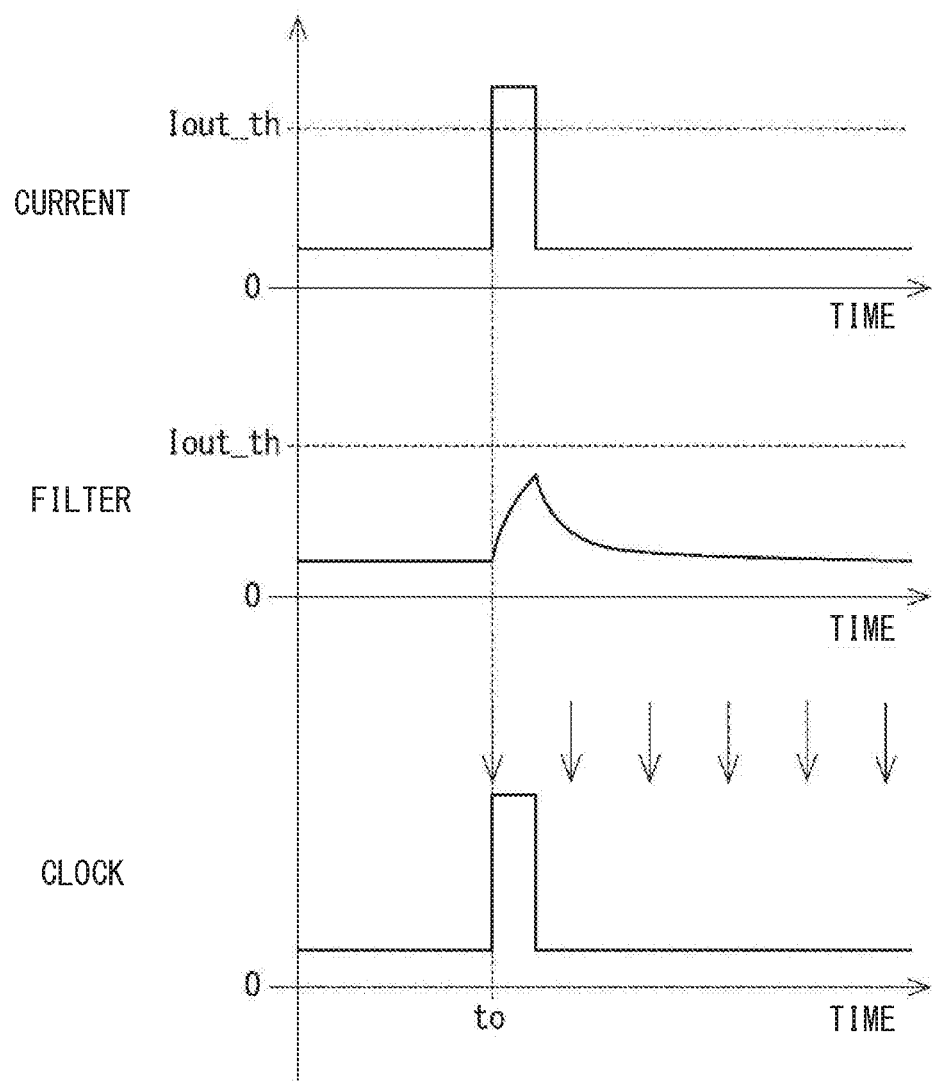
FIG. 8 is a time chart showing a transient current variation waveform.

On the other hand, FIG. 8 shows a waveform corresponding to FIG. 7 in the case of a transient current variation. When a transient current variation such as noise occurs at a time t0, the current waveform acquired by the short circuit detection circuit 50 momentarily exceeds the short circuit detection threshold Iout_th, but the short circuit is not detected because the filtered waveform is less than the short circuit detection threshold value Iout_th. Since the count value of the clock does not reach the predetermined value, a short circuit is not detected.

For example, in a Bulk-current injection test of the ISO11452-4, noises having a frequency of 1 MHz are introduced. Therefore, the short circuit detection circuit 50 may filter out high-frequency components higher than 1 MHz so as not to detect a transient variation of a frequency higher than 1 MHz. Alternatively, the short circuit may be detected only when the short circuit state is maintained for a time of 1 µs or more.

Next, referring to time charts of FIGS. 9, 19, and 20, the limitation of the short circuit current Iout_short according to the present embodiment will be described in comparison with the first comparative example in which a current is completely interrupted at the time of short circuit detection and a second comparative example in which the short circuit detection function is not provided. A horizontal axis in each chart indicates a transition state in which the state shifts from a normal state in which there is no short circuit to a short-circuited state between the terminals and returns to the normal state. Three columns from a top of the vertical axis of each chart show changes in the output terminal voltage for each mating terminal to which the output terminal 23 is short-circuited, and columns below those columns show changes in the short circuit detection function, the current flowing through the branch path 33, and the maximum supply output current of the signal generation circuit 60.

In common to the respective charts, in the normal state, the normal time current Iout_normal flows through the branch path 33, and when a short circuit occurs between the terminals, the current flowing through the branch path 33 increases. The output terminal voltage is a voltage corresponding to the normal time current Iout_normal in the normal state. The output terminal voltage rises to the power supply voltage Vc when the power supply terminal 21 and the output terminal 23 are short-circuited, and falls to the ground (i.e., 0 V) when the output terminal 23 and the ground terminal 22 are short-circuited. When the output terminals 231 and 232 are short-circuited in the configuration shown in FIG. 4, the output terminal voltage drops to a voltage close to the ground, for example.

The current upper limit value Iout_limit shown in a column of "current flowing in the branch path" is an upper limit value of a current based on the supply capacity of the constant power supply circuit 11, and more specifically, is an upper limit value of a current which can be supplied while maintaining a prescribed output voltage by the constant power supply circuit 11. For example, when the constant power supply circuit 11 of 5 V/20 mA is used, 20 mA corresponds to the current upper limit value Iout_limit. If the constant power supply circuit 11 attempts to supply a current in excess of 20 mA, a voltage drop from the 5 V will occur, and functions using 5 V in the system will be adversely affected. In other words, the current upper limit value Iout_limit is a critical value that does not cause a voltage drop in the output voltage of the constant power supply circuit 11.

The maximum supply output current Iout_max of the signal generation circuit 60 is determined based on current carrying capacities of elements configuring the signal generation circuit 60, for example, a current in a saturated region of a transistor used as the switch element, or the like.

Referring to FIG. 20, in the second comparative example without the short circuit detection function, the maximum supply output current Iout_max of the signal generation circuit 60 does not change even at the time of the short circuit. For that reason, a current exceeding the current upper limit value Iout_limit flows through the branch path 33, which may adversely affect the system. In the second comparative example, when the output terminal returns to the normal state, the output terminal voltage returns to the voltage before the occurrence of the short circuit, and a correct output signal can be transmitted.

In the first comparative example shown in FIG. 19, the short circuit detection threshold value Iout_th greater than the normal time current Iout_normal is set. In other words, a relationship of the following Expression (1) is satisfied. The short circuit detection threshold value Iout_th is set to a value greater than the normal time current Iout_normal, to thereby prevent erroneous detection of the short circuit state at the normal time.

$$Iout\_normal < Iout\_th \quad (1)$$

When a short circuit between the terminals occurs and it is detected that the current flowing through the branch path 33 exceeds the short circuit detection threshold value Iout_th, the device in the first comparative example completely interrupts the maximum supply output current Iout_max of the signal generation circuit 60. As a result, a current flowing through the branch path 33 becomes 0, and the current becomes surely less than the current upper limit value Iout_limit, thereby preventing the system from being adversely affected. When the short circuit current is extremely large, the elements included in the signal generation circuit 60 can be protected from overcurrent.

However, in the first comparative example, since the current is completely 0, when the terminals return from the short circuit state to the normal state, the short circuit detection circuit 50 cannot detect the amount of change in the current and cannot detect that the terminals have returned to the normal state. For that reason, after returning to the normal state, the output terminal voltage becomes an indefinite state as indicated by a dashed line, and the terminals cannot transmit a correct output signal.

Figure 9:
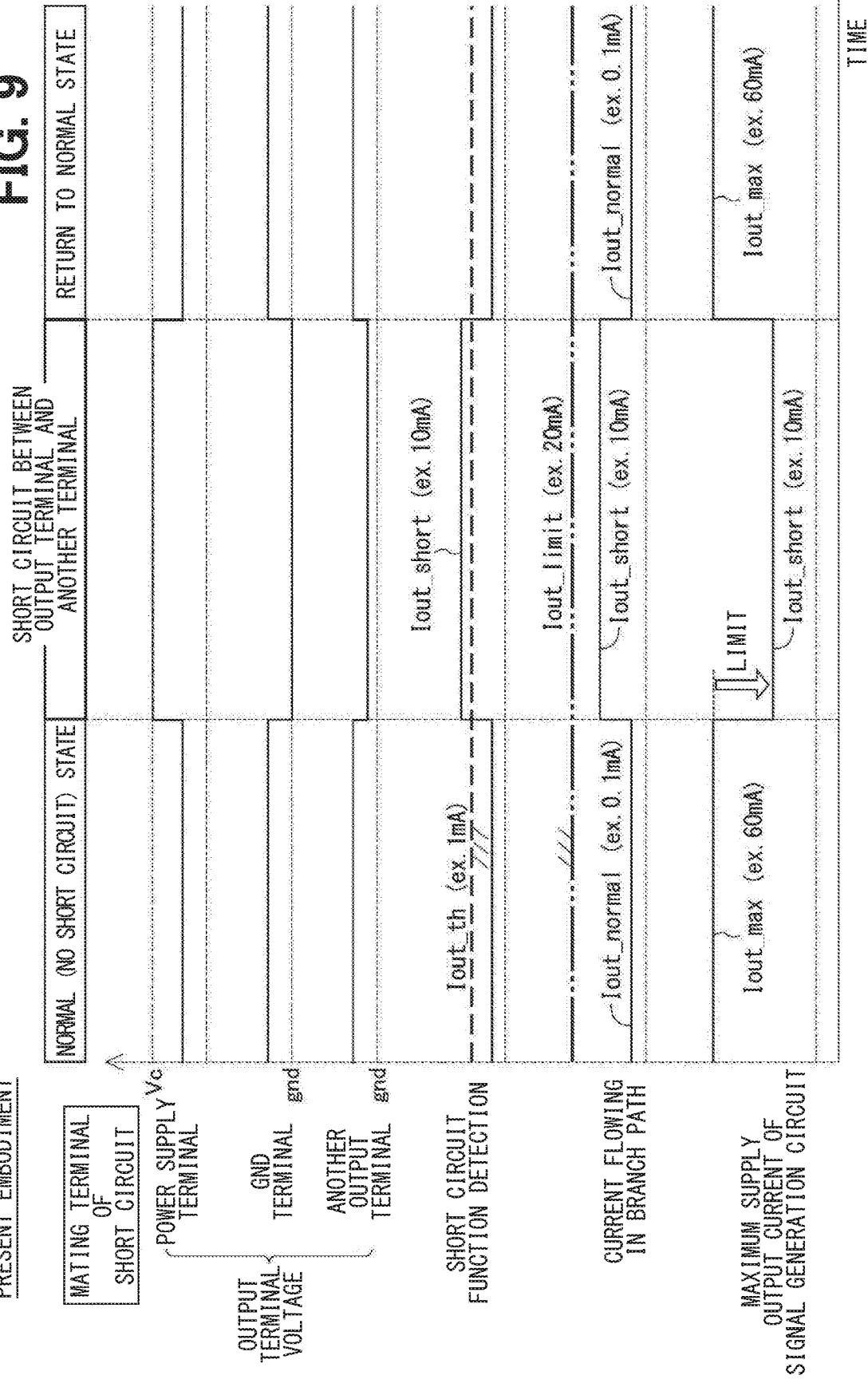
FIG. 9 is a time chart showing a change in current at the time of short circuiting between terminals according to the present embodiment.

In contrast to the first comparative example, in the present embodiment shown in FIG. 9, when a short circuit is detected by the short circuit detection circuit 50, the short circuit current Iout_short flowing through the branch path 33 is limited. The short circuit current Iout_short is set to a value equal to or greater than the short circuit detection threshold Iout_th and less than the current upper limit value Iout_limit. The short circuit current Iout_short is set to a value less than the maximum supply output current Iout_max at the normal time. In other words, relationships of the following Expressions (2) and (3) are satisfied.

$$Iout\_th \leq Iout\_short < Iout\_limit \quad (2)$$

$$Iout\_short < Iout\_max \quad (3)$$

Since the short circuit current Iout_short is set to be equal to or greater than the short circuit detection threshold Iout_th in this manner, the erroneous determination that the terminals are in the normal state having no short circuit at the time of short circuit is prevented. Since the short circuit current Iout_short is less than the current upper limit value Iout_limit, the system is prevented from being adversely affected in the same manner as in the first comparative example.

When the terminals return from the short circuit state to the normal state, the short circuit detection circuit 50 detects that the current flowing through the branch path 33 falls below the short circuit detection threshold Iout_th, and returns the maximum supply output current Iout_max of the signal generation circuit 60 to the value at the normal time. Since the output terminal voltage returns to the voltage before the occurrence of the short circuit, the signal output device 20 according to the present embodiment can transmit a correct output signal quickly as in the second comparative example.

FIG. 9 shows an example of respective current values applied to the in-vehicle system and assuming an embodiment of communicating a signal conforming to the SENT communication standard (SAE-J2716). The basis of this numerical example will be described in order. First, in the maximum supply output current Iout_max at the normal time, there is a no need to ensure a tolerance for EMC (that is, electromagnetic compatibility) in the in-vehicle system. For example, in the Bulk-current injection test of ISO11452-4, a current of 60 mA is injected even at the lowest level. In consideration of the above fact, the maximum supply output current Iout_max at the normal time is set to 60 mA. Incidentally, the maximum supply output current Iout_max at the normal time may be set to 100 mA, 150 mA, 200 mA at a more stringent level.

In the current flowing through the branch path 33 at the normal time, according to the SAE-J2716 JAN2010 revised version, it is required to output a voltage of 0.5 V when a DC load current is 0.1 mA. Therefore, the normal time current Iout_normal is assumed to be, for example, 0.1 mA.

In the SAE-J2716 JAN2010 revised version, the DC load current is determined according to a load resistor of a receiver side. Since a resistance value of a pull-up resistor is defined to be 10 kΩ to 55 kΩ, the normal time current Iout-normal in the power supply voltage 5 V is 0.09 mA to 0.5 mA. Although the resistance value of the pull-down resistor is not clearly defined, the normal time current Iout-normal at the power supply voltage 5 V is, for example, 5 mA when the resistance value is 1 kΩ, and 5 µA when the resistance value is 1 MO. As described above, the normal time current Iout_normal may be assumed to fall within a range of 0.09 mA to 0.5 mA, or 5 µA to 5 mA.

According to the SAE-J2716 JAN2010 revised version, since a power supply current supplied to the system is required to be 20 mA or greater, the current upper limit value Iout-limit is set to 20 mA. Assuming that the normal time current Iout_normal is 0.1 mA, the short circuit detection threshold Iout_th and the short circuit current Iout_short can be arbitrarily set between 0.1 mA and 20 mA according to Expressions (1) and (2). Therefore, for example, the short circuit detection threshold value Iout_th can be set to 1 mA, and the short circuit current Iout_short can be set to 10 mA. The short circuit detection threshold value Iout_th may not be fixed to one value, but may be set within a range of conditions satisfying Expressions (1) and (2).

Figure 10:
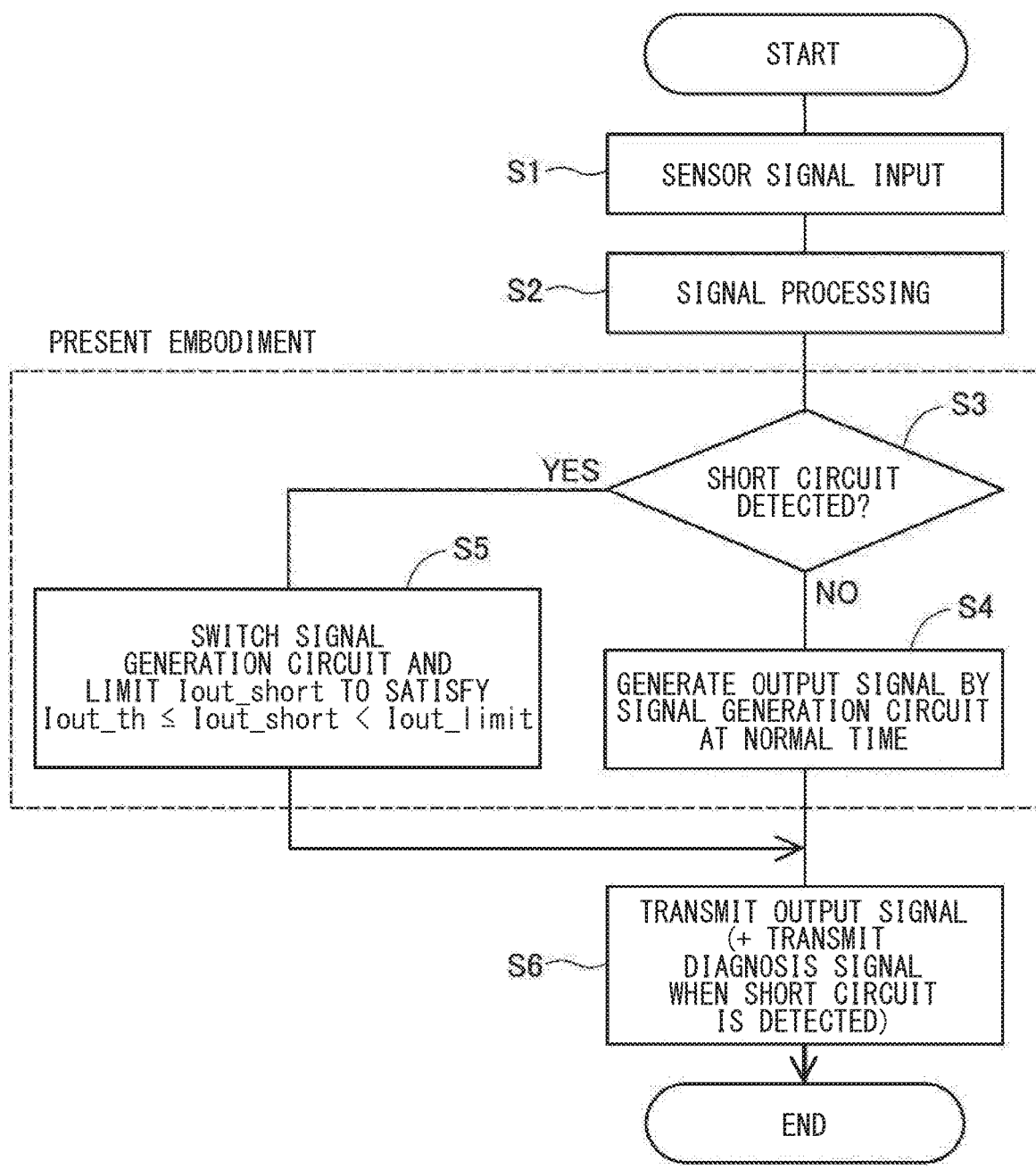
FIG. 10 is a flowchart of a signal output process according to the present embodiment.

The processing according to the present embodiment is shown in a flowchart of FIG. 10. In the description of the flowchart, a symbol "S" indicates a step. A portion surrounded by a dashed line is processing specific to the present embodiment. In 51, for example, a detection signal of the sensor is input to the signal output device 20. In S2, the input circuit 40 performs signal processing. In S3, it is determined whether a short circuit has been detected by the short circuit detection circuit 50.

When the short circuit is not detected and a determination of NO is made in S3, the process proceeds to S4, and an output signal is generated by the signal generation circuit 60 at the normal time. On the other hand, when a short circuit is detected and a determination of YES is made in S3, the switching circuits 61 and 62 switch the current carrying capacity or configuration of the signal generation circuit 60 in S5. As a result, the short circuit current Iout_short is limited so as to satisfy the relationship of "Iout_th≤Iout_short<Iout_limit". In S6, a signal is transmitted from the output terminal 23.

When a short circuit is detected, the signal output device 20 may transmit a signal such as a diagnosis signal for notifying the ECU 10, which is a destination device of the output signal, of information indicating that the short circuit is detected, in addition to the output signal. In that case, the signal output device 20 may transmit information from the output terminal 23, or may transmit information by use of a power supply line. Alternatively, in a configuration in which multiple signal output devices 201 and 202 are redundantly provided as shown in FIG. 4, a signal output device on the side which is not short-circuited may transmit a signal.

Next, a specific configuration for limiting the short circuit output current Iout_short with respect to the normal time maximum supply output current Iout_max when a short circuit is detected will be described for each embodiment with reference to FIGS. 11 to 18. In first and second embodiments, a current carrying capacity of a signal generation circuit 60 is switched to another, and in third to eighth embodiments, a configuration of the signal generation circuit 60 is switched to another. In the first to eighth embodiments, a configuration in which the short circuit detection circuit 50 is provided in the branch path 33 will be exemplified.

The short circuit detection circuit 50 detects a voltage across a resistor 53 provided in the branch path 33 by a voltage detection circuit 54. A voltage detected by the voltage output circuit 54 is compared with a reference voltage Vref by a comparator circuit 55. When the detected voltage is greater than the reference voltage Vref, it is determined that a short circuit occurs, and switching circuits 61 and 62 are commanded to switch the current carrying capacity or the configuration of the signal generation circuit 60 to another. Dashed arrows output from the switching circuits 61 and 62 indicate switching signals. In the first to eighth embodiments, it is assumed that the current carrying capacity or the configuration of each element of the upper path 31 and the lower path 32 is switched to another in the same manner. As a reference numeral of the signal generation circuit in each embodiment, the third digit following "60" is given a number of the embodiment.

First Embodiment

Figure 11:
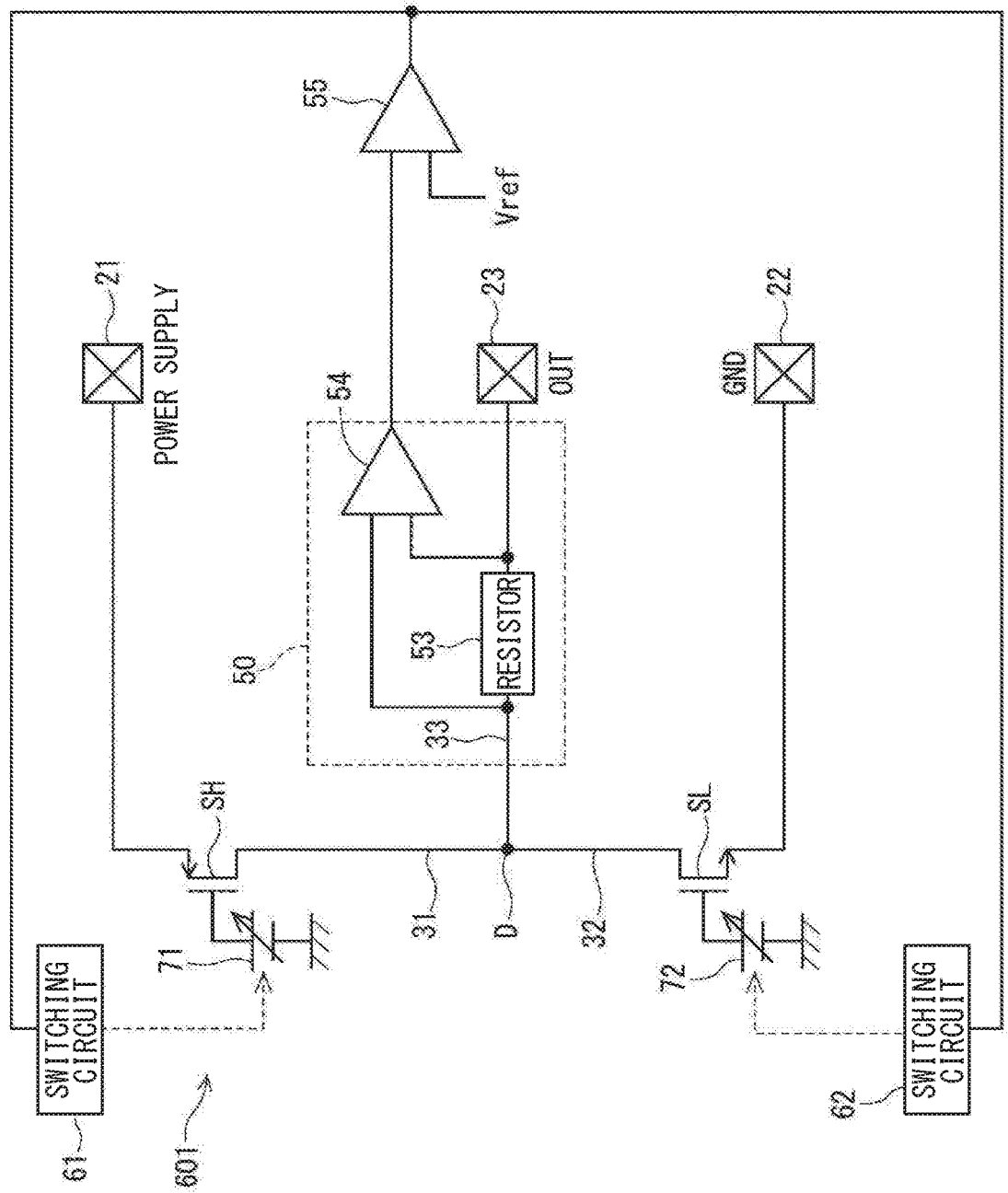
FIG. 11 is a configuration diagram of a signal generation circuit according to a first embodiment.

A signal generation circuit 601 according to the first embodiment shown in FIG. 11 is provided with gate voltage regulators 71 and 72 for respectively adjusting gate voltages of a switch element SH of an upper path 31 and a switch element SL of a lower path 32. The switching circuits 61 and 62 switch the current carrying capacity of the signal generation circuit 601 by lowering or raising the gate voltages of the switch elements SH and SL as compared to the normal time when a short circuit is detected, thereby reducing an on-state current. In an Nmos transistor, a gate-source potential difference is reduced by lowering a gate voltage, and an on-state current is reduced. In a Pmos transistor, a gate-source potential difference is reduced by increasing a gate voltage, and an on-state current is reduced.

Second Embodiment

Figure 12:
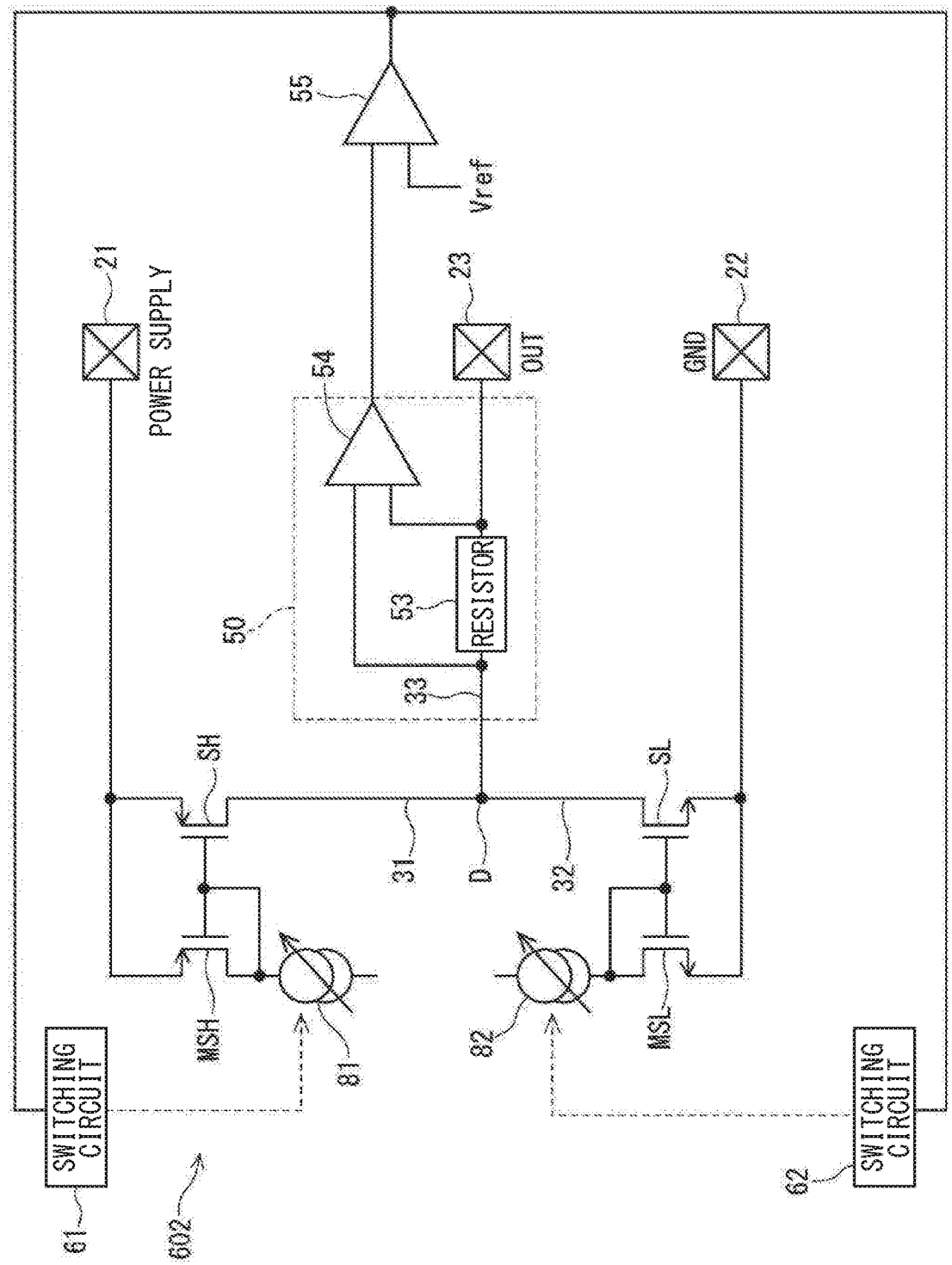
FIG. 12 is a configuration diagram of a signal generation circuit according to a second embodiment.

A signal generation circuit 602 according to a second embodiment shown in FIG. 12 is provided with mirror elements MSH and MSL whose gates are connected to gates of a switch element SH of an upper path 31 and a switch element SL of a lower path 32, respectively, and current regulators 81 and 82 connected to the mirror elements MSH and MSL, respectively. Switching circuits 61 and 62 switch a current carrying capacity of a signal generation circuit 602 by decreasing a reference of the switch elements SH and SL, that is, a current amount of a reference current source as compared to the normal time when a short circuit is detected, thereby decreasing an on-state current.

Third Embodiment

Figure 13:
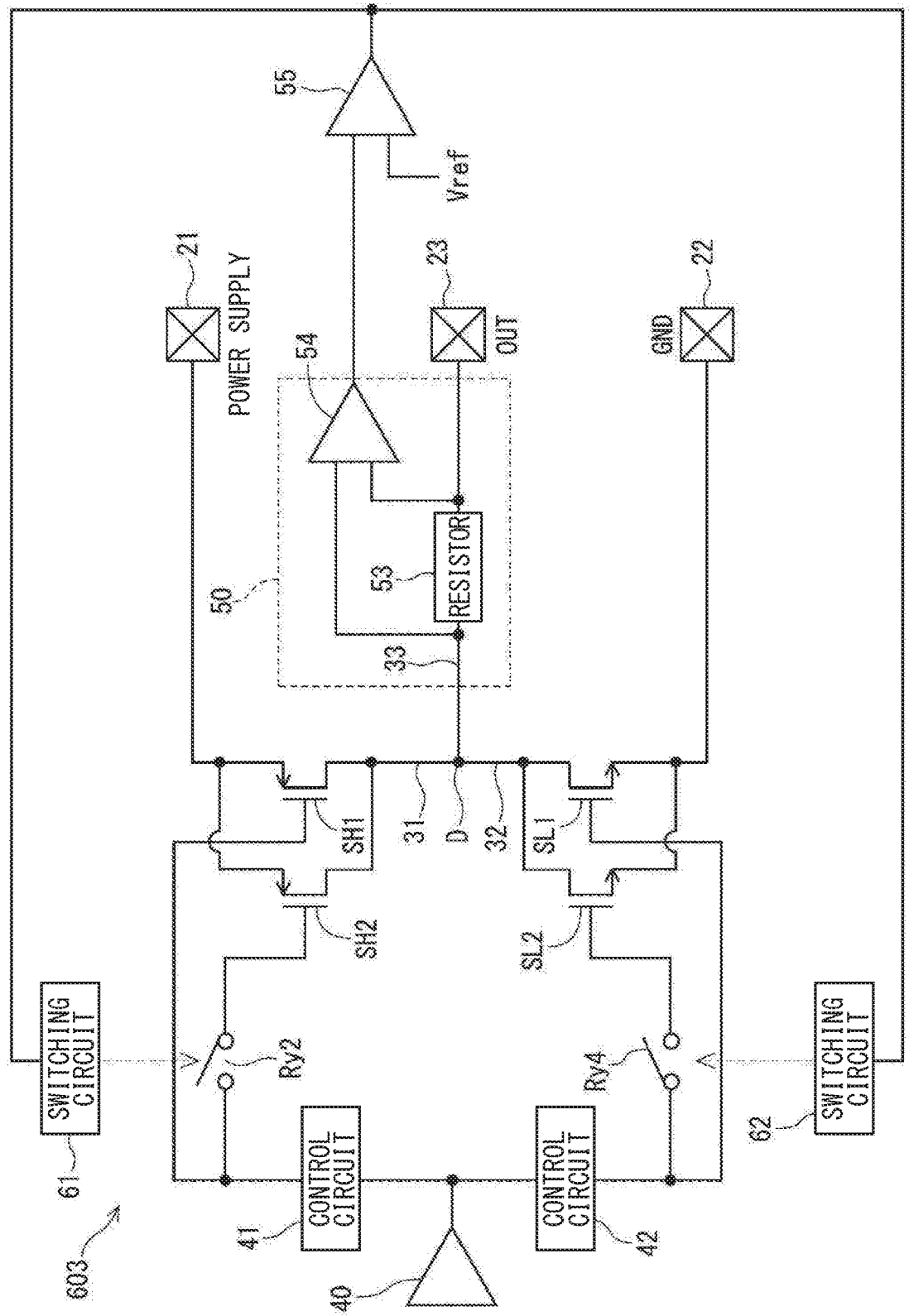
FIG. 13 is a configuration diagram of a signal generation circuit according to a third embodiment.

In a signal generation circuit 603 according to a third embodiment shown in FIG. 13, two switch elements SH1 and SH2 are connected in parallel to an upper path 31, and two switch elements SL1 and SL2 are connected in parallel to a lower path 32. A gate of the switch element SH2 is connected to a control circuit 41 through a relay Ry2, and a gate of the switch element SL2 is connected to a control circuit 42 through a relay Ry4. At the normal time, the relays Ry2 and Ry4 is connected, and the switch element SH1, SH2 and the switch element SL1, SL2 are both turned on so that a large on-state current can be carried in parallel.

At the time of detecting the short circuit, the switching circuits 61 and 62 disconnect the relays Ry2 and Ry4, so that the switch elements SH2 and SL2 are not turned on. Therefore, only one switch element SH1 is turned on in the upper path 31 and only one switch element SL1 is turned on in the lower path 32, thereby limiting the short circuit current Iout_short. As described above, when a short circuit is detected, the switching circuits 61 and 62 according to the third embodiment switch a configuration of the signal generation circuit 603 so as to reduce the number of switch elements to be turned on among the multiple switch elements connected in parallel to each other as compared to the normal time.

Fourth Embodiment

Figure 14:
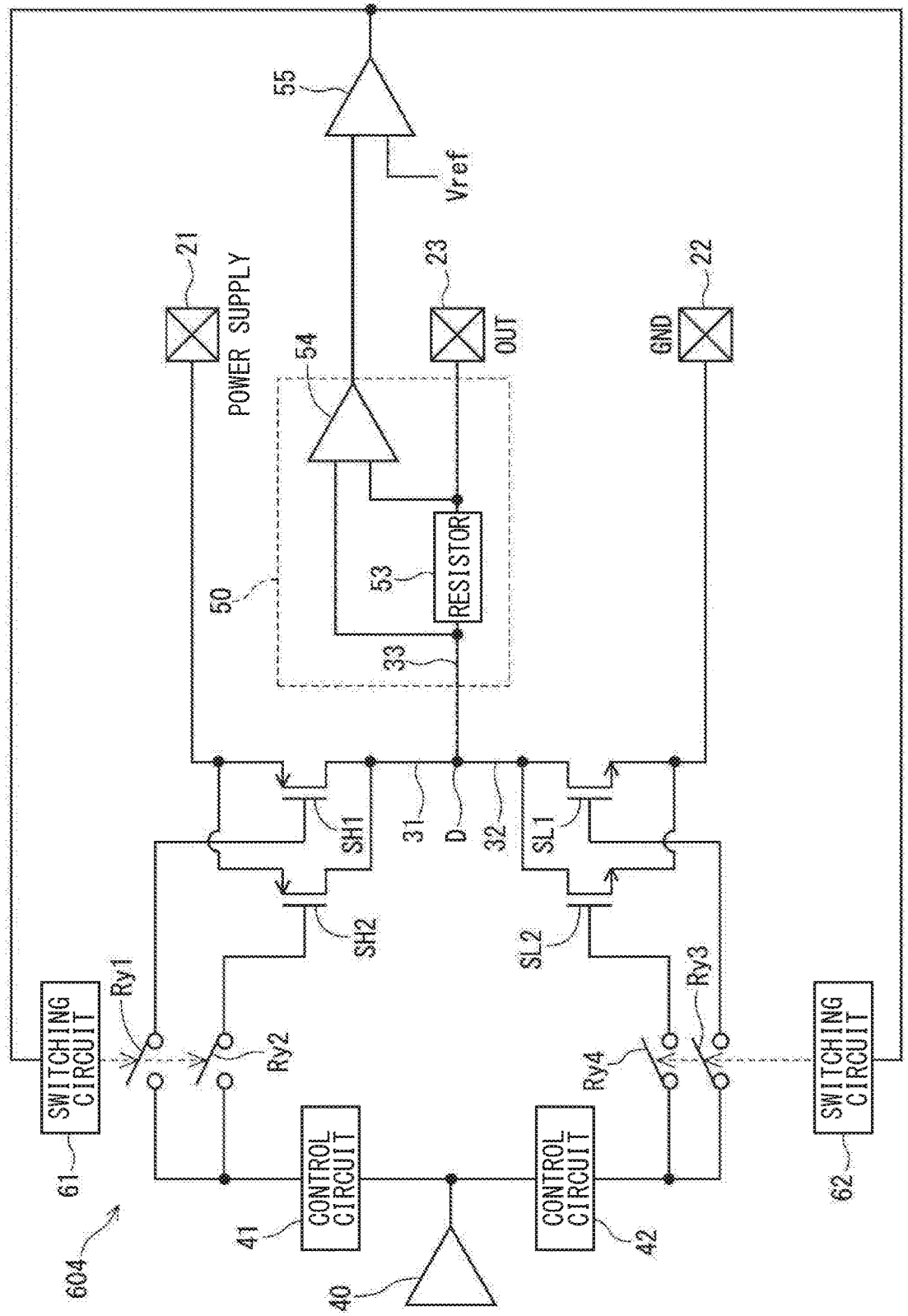
FIG. 14 is a configuration diagram of a signal generation circuit according to a fourth embodiment.

In a signal generation circuit 604 according to a fourth embodiment shown in FIG. 14, two switch elements SH1 and SH2 are connected in parallel to an upper path 31, and two switch elements SL1 and SL2 are connected in parallel to a lower path 32. Gates of the switch elements SH1 and SH2 are connected to a control circuit 41 through relays Ry1 and Ry2, respectively. Gates of the switch elements SL1 and SL2 are connected to a control circuit 42 through relays Ry3 and Ry4, respectively. For example, the switch element SH1 and SL1 are elements having a greater on-state current than that of the switch element SH2 and SL2. At the normal time, the relays Ry1 and Ry3 is connected, and the relays Ry2 and Ry4 are disconnected so that a relatively large on-state current flows through the switch elements SH1 and SL1.

At the time of detecting a short circuit, the switching circuits 61 and 62 disconnect the relays Ry1 and Ry3, connect the relays Ry2 and Ry4, and switchingly supply a current to the switch elements SH2 and SL2 having a relatively low on-state current, thereby limiting the short circuit current Iout_short. As described above, when a short circuit is detected, the switching circuits 61 and 62 according to the fourth embodiment switch the configuration of the signal generation circuit 604 so as to supply the current to the switch elements having a relatively small on-state current as compared to the normal time.

Fifth Embodiment

Figure 15:
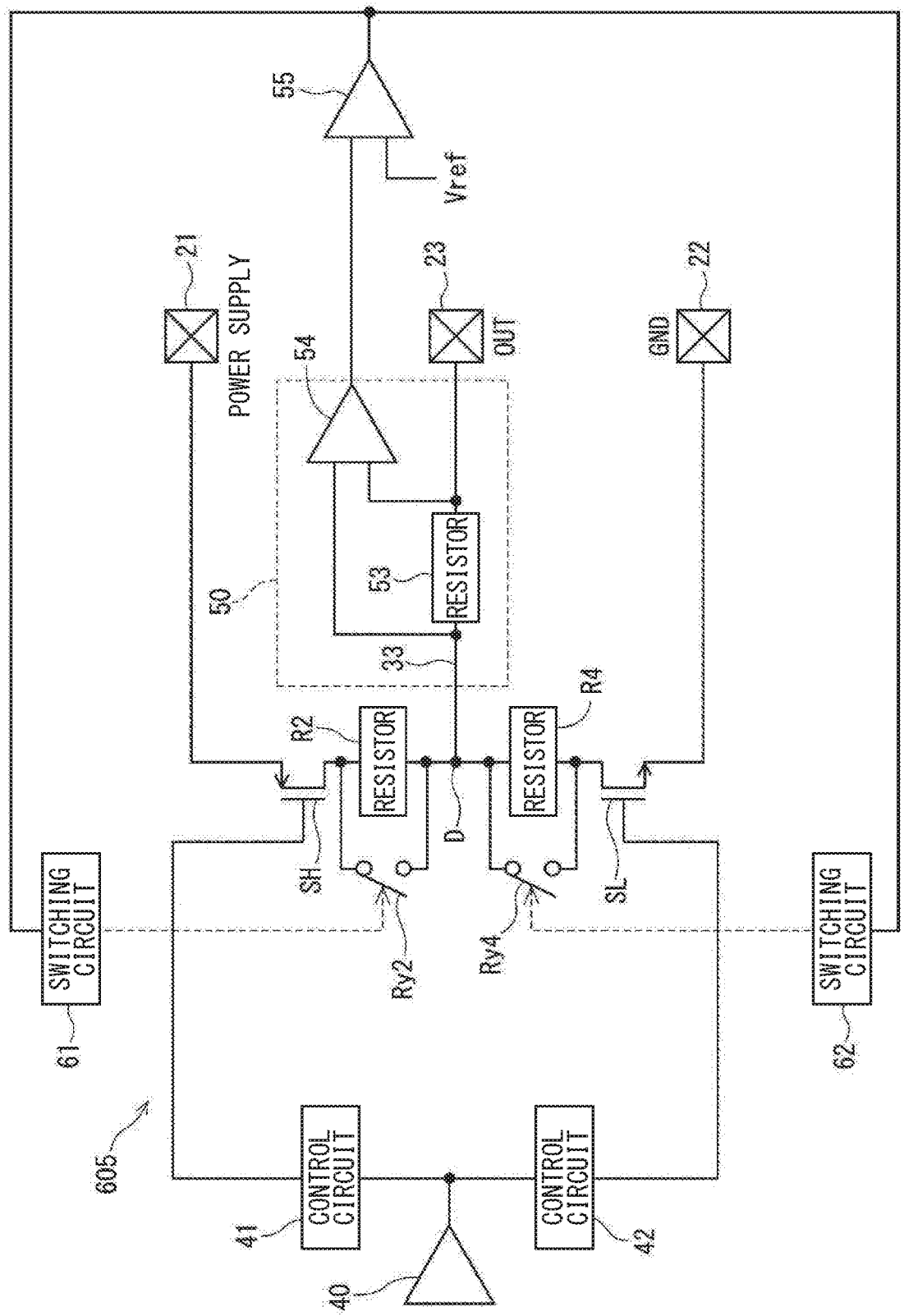
FIG. 15 is a configuration diagram of a signal generation circuit according to a fifth embodiment.

In a signal generation circuit 605 according to a fifth embodiment shown in FIG. 15, resistive elements R2 and R4 are connected in series to a switch element SH of an upper path 31 and a switch element SL of a lower path 32, respectively. In addition, bypass paths for bypassing the resistive elements R2 and R4 and relays Ry2 and Ry4 for opening and closing the bypass paths are provided, respectively. At the normal time, when the relays Ry2 and Ry4 are connected and the switch elements SH and SL are turned on, the currents of the upper path 31 and the lower path 32 flow through the respective bypass paths with no resistive element.

At the time of detecting the short circuit, the switching circuits 61 and 62 disconnect the relays Ry2 and Ry4, so that the on-state currents flow through the respective resistive elements R2 and R4 when the switch elements SH and SL are turned on. Therefore, the short circuit current Iout_short is limited. As described above, when a short circuit is detected, the switching circuits 61 and 62 according to the fifth embodiment switch the configuration of the signal generation circuit 605 so that the resistive elements are connected in series to the respective switch elements. As a modification of the fifth embodiment, the resistive elements may be connected in series or in parallel to the switch elements at the normal time, and when a short circuit is detected, the switching circuits 61 and 62 may switch the configuration of the signal generation circuit so as to increase the resistance value of the resistive elements as compared to the normal time.

Sixth Embodiment

Figure 16:
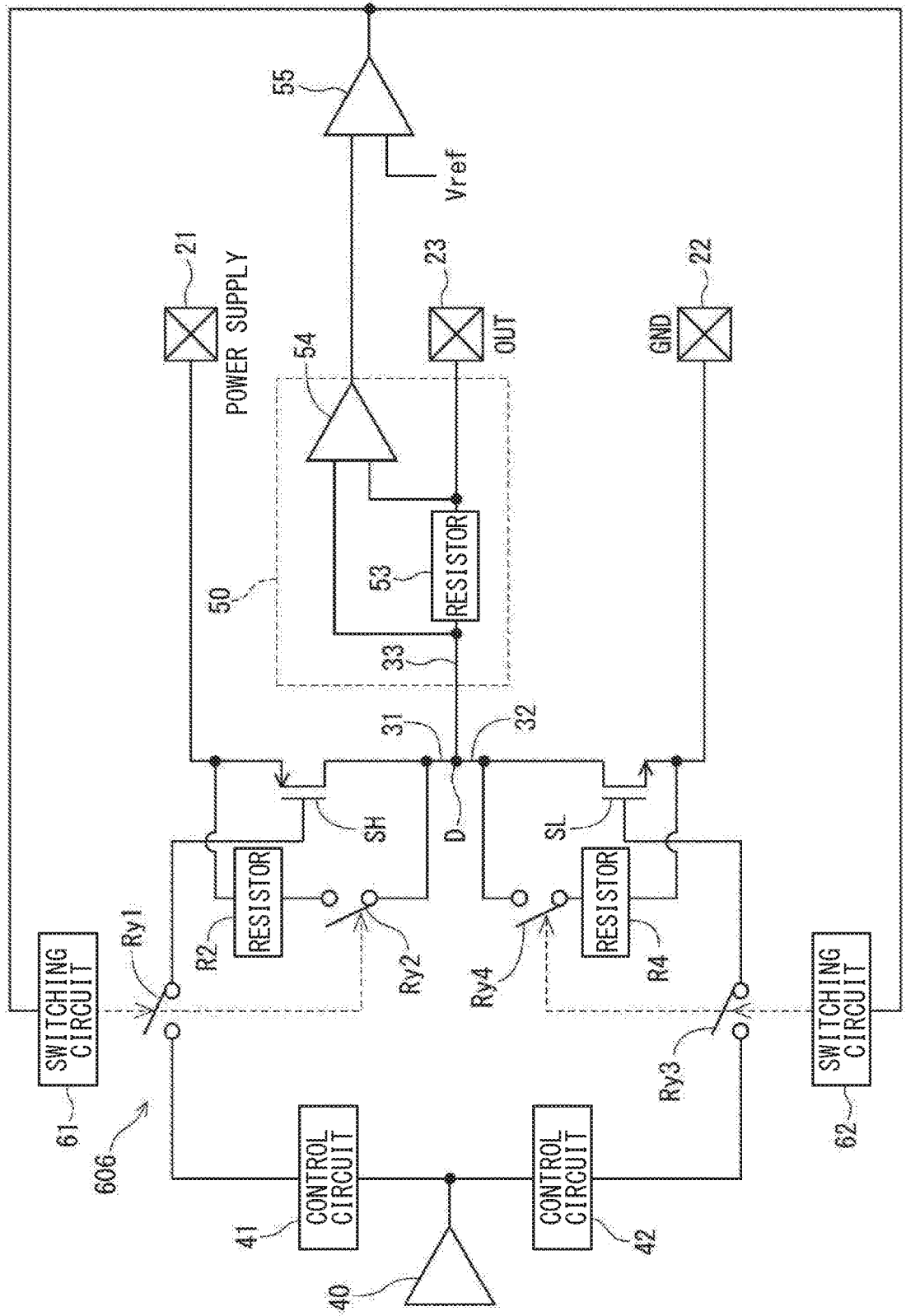
FIG. 16 is a configuration diagram of a signal generation circuit according to a sixth embodiment.

In a signal generation circuit 606 according to a sixth embodiment shown in FIG. 16, resistive elements R2 and R4 are connected in parallel to a switch element SH of an upper path 31 and a switch element SL of a lower path 32, respectively. Gates of the switch elements SH and SL are connected to control circuits 41 and 42 through relays Ry1 and Ry3, respectively. In addition, paths in which the resistive elements R2 and R4 are provided are opened and closed by relays Ry2 and Ry4, respectively. At the normal time, the relays Ry1 and Ry3 are connected, and the relays Ry2 and Ry4 are disconnected, so that an on-state current flows through the switch elements SH and SL.

At the time of detecting a short circuit, the switching circuits 61 and 62 disconnect the relays Ry1 and Ry3 and connect the relays Ry2 and Ry4, thereby causing a current flows through the resistive elements R2 and R4, so that the short circuit current Iout_short is limited. As described above, when the short circuit is detected, the switching circuits 61 and 62 according to the sixth embodiment switch the configuration of the signal generation circuit 605 from the path passing through the switch elements to the path passing through the resistive elements.

Seventh Embodiment

Figure 17:
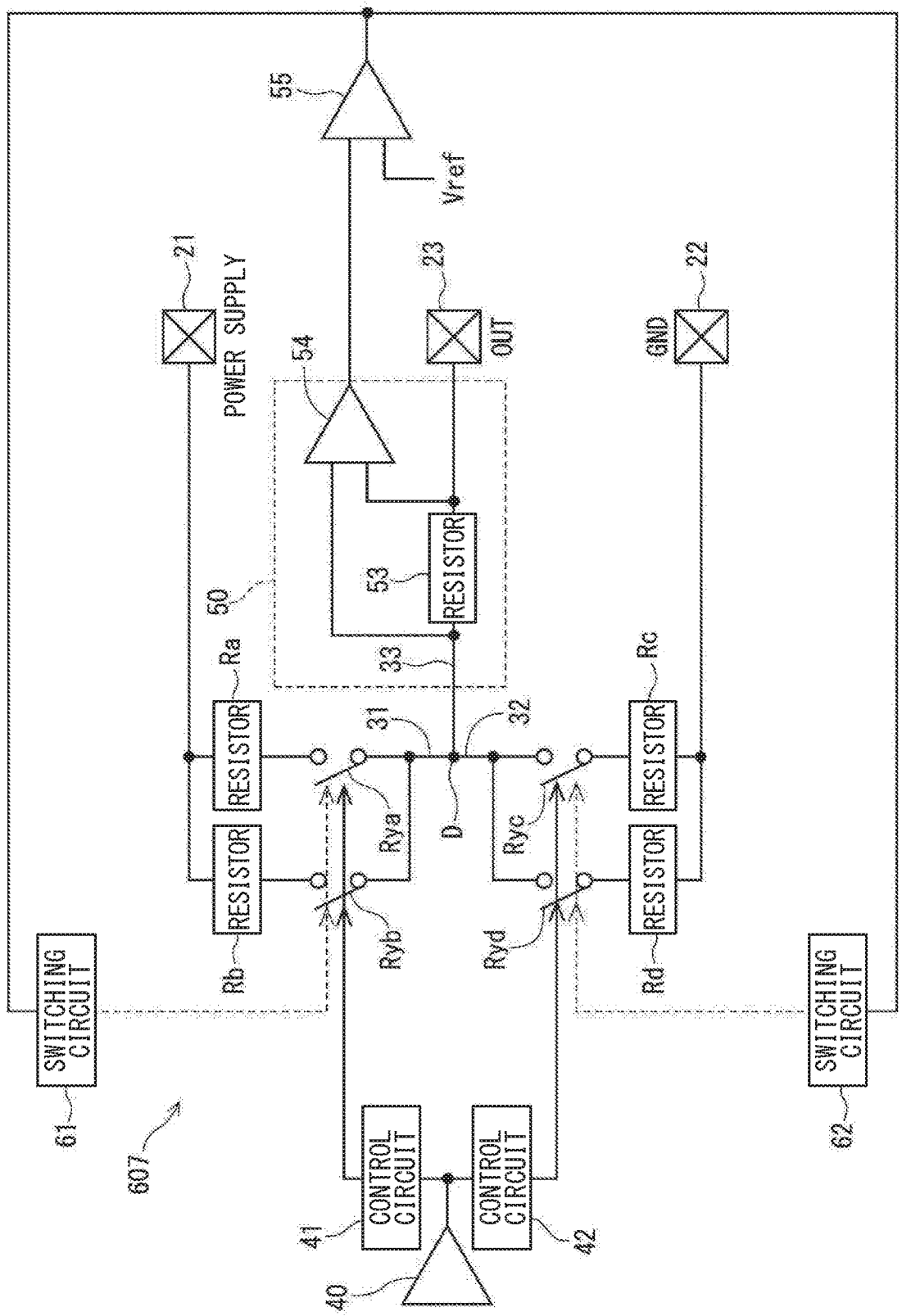
FIG. 17 is a configuration diagram of a signal generation circuit according to a seventh embodiment.

In a signal generation circuit 607 according to a seventh embodiment shown in FIG. 17, resistive elements Ra and Rb are connected in parallel to an upper path 31, and resistive elements Rc and Rd are connected in parallel to a lower path 32. In addition, relays Rya and Ryb for opening and closing respective paths in which the resistive elements Ra and Rb are provided, and relays Ryc and Ryd for opening and closing respective paths in which the resistive elements Rc and Rd are provided, are provided. A symbol of each resistive element also represents a resistance value of the resistive element. The following configuration can be achieved by setting the respective resistance values.

(1) It is assumed that the resistance value Ra=Rb and the resistance value Rc=Rd. At the normal time, the switching circuits 61 and 62 connect all the relays Rya, Ryb, Ryc, and Ryd, and connect the resistive elements Ra and Rb and the resistive elements Rc and Rd in parallel to each other, respectively, to thereby reduce the resistance value. When a short circuit is detected, the switching circuits 61 and 62 disconnect one of the relays Rya and Ryb and one of the relays Ryc and Ryd, and configure each of the upper path 31 and the lower path 32 with one resistive element. This increases the resistance value and limits the short circuit current Iout_short.

(2) It is assumed to satisfy the resistance value Ra<Rb and the resistance value Rc<Rd. At the normal time, the switching circuits 61 and 62 connect the relays Rya and Ryc, and disconnect the relays Ryb and Ryd, so as to supply a current through the resistive elements Ra and Rc having small resistance values. When a short circuit is detected, the switching circuits 61 and 62 disconnect the relays Rya and Ryc, connect the relays Ryb and Ryd, and supply a current through the resistive elements Rb and Rd having large resistance values, thereby limiting the short circuit current Iout_short.

(3) It is assumed to satisfy the resistance value Ra<Rb and the resistance value Rc<Rd. As with the item (1), at the normal time, the switching circuits 61 and 62 connect the resistive elements Ra and Rb and the resistive elements Rc and Rd in parallel, respectively. When the short circuit is detected, the switching circuits 61 and 62 limit the short circuit current Iout_short by configuring each of the upper path 31 and the lower path 32 with one resistive element.

Eighth Embodiment

Figure 18:
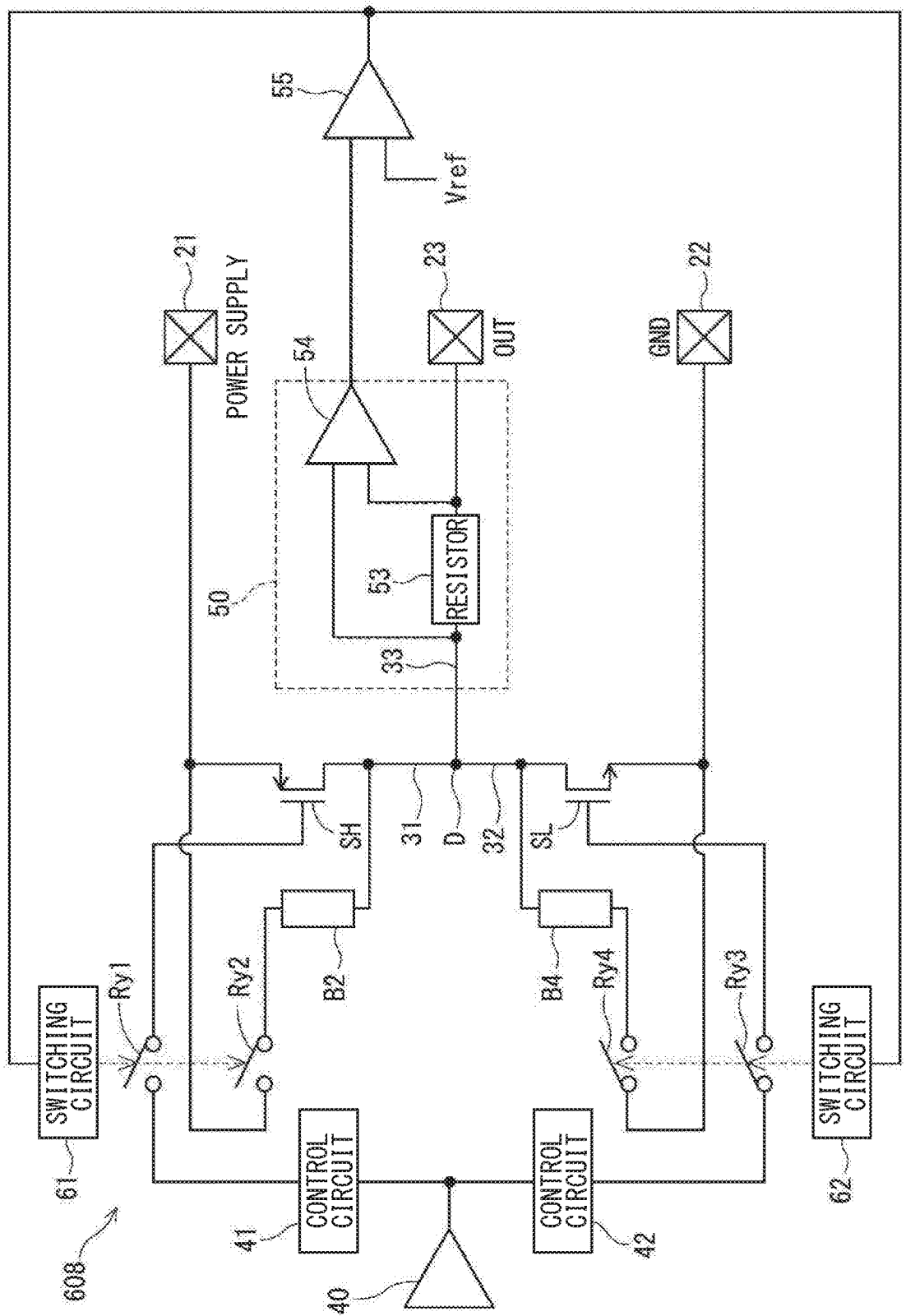
FIG. 18 is a configuration diagram of a signal generation circuit according to an eighth embodiment.

A signal generation circuit 608 according to an eighth embodiment shown in FIG. 18 is a generalized representation of the signal generation circuit 606 in the sixth embodiment. In an upper path 31, a switch element SH and an element B2 of a bypass path are connected in parallel to each other, and in a lower path 32, a switch element SL and an element B4 of a bypass path are connected in parallel to each other. The elements B2 and B4 of the bypass paths are set so as to have a large resistance or a small current carrying amount with respect to the switch elements SH and SL, respectively.

Gates of the switch elements SH and SL are connected to control circuits 41 and 42 through relays Ry1 and Ry3, respectively. The paths provided with the elements B2 and B4 in the bypass paths are opened and closed by the relays Ry2 and Ry4, respectively. At the normal time, the relays Ry1 and Ry3 are connected, and the relays Ry2 and Ry4 are disconnected, so that an on-state current flows through the switch elements SH and SL.

At the time of detecting a short circuit, the switching circuits 61 and 62 disconnect the relays Ry1 and Ry3 and connect the relays Ry2 and Ry4, respectively, so that the currents in the upper path 31 and the lower path 32 flow through the bypass paths to which the elements B2 and B4 are connected. Therefore, the short circuit current Iout_short is limited.

As described above, the switching circuits 61 and 62 can switch the current carrying capacity or configuration of the signal generation circuit 60 in various methods so as to limit the short circuit current Iout_short. The first to eighth embodiments may be implemented in combination as appropriate. The number of switch elements and resistive elements is not limited to the number shown in the embodiments described above, and may be changed as appropriate.

Other Embodiments (a) The switching circuits 61 and 62 of the according to the embodiments described above switch the current carrying capacity or the configuration of the respective elements of the upper path 31 and the lower path 32 in the signal generation circuit 60 in the same manner when the short circuit is detected. This makes it possible to limit the short circuit current Iout_short for any pattern of the short circuit between the power supply terminal 21 and the output terminal 23, the short circuit between the output terminal 23 and the ground terminal 22, and the short circuit between the output terminals 231 and 232 in the same manner.

However, for example, there may be a case in which the power supply terminal 21 and the output terminal 23 are physically separated from each other, and there is substantially no possibility of a contact of the terminal with a waterdrop or a metal foreign matter, and only the possibility of a short circuit between the output terminal 23 and the ground terminal 22 may be assumed. In that case, a short circuit detection circuit 51 may be provided only in the upper path 31, and the switching circuit may be configured to switch the current carrying capacity or the configuration of the elements of the upper path 31. Conversely, when only the possibility of a short circuit between the power supply terminal 21 and the output terminal 23 is assumed, the short circuit detection circuit 52 may be provided only in the lower path 32, and the switching circuit may be configured to switch the current carrying capacity or the configuration of the elements of the lower path 32.

(b) In the embodiments described above, the constant power supply circuit 11 is used as the DC power supply, the current upper limit value Iout_limit is determined to a critical value that does not cause a voltage drop in the constant power supply circuit 11. However, the DC power supply for supplying a power to the signal output device is not limited to the above method. When a power supply circuit or the like of another method is used, a current value which does not adversely affect the system may be set as the current upper limit value Iout_limit in accordance with each power supply characteristic.

(c) The signal output device according to the present disclosure is applicable not only to a system for controlling the operation of an in-vehicle actuator, but also to any system in which the short circuit between an output terminal and another terminal may occur.

The present disclosure is not limited to the embodiments described above, and can be implemented in various forms within the scope of the present disclosure.

Although the present disclosure has been described in accordance with the embodiments, it is understood that the present disclosure is not limited to such embodiments or structures. The present disclosure encompasses various modifications and variations within the scope of equivalents. In addition, various combinations and forms, as well as other combinations and forms including only one element, more than that, or less, among them, fall within the scope and concept of the present disclosure.

What is claimed is:

1. A signal output device comprising:
   a power supply terminal configured to be connected to a direct current (DC) power supply;
   a ground terminal configured to be grounded;
   an output terminal configured to be connected through a branch path to a voltage dividing point provided in a middle of a main path which is a current path connecting the power supply terminal and the ground terminal, and to transmit an output signal based on a voltage of the voltage dividing point to an outside;
   a signal generation circuit configured to adjust the voltage of the voltage dividing point and to generate the output signal;
   a short circuit detection circuit configured to be provided on at least one of an upper path which is a path between the power supply terminal and the voltage dividing point in the main path, a lower path which is a path between the voltage dividing point and the ground terminal in the main path, and the branch path, and to detect a short circuit between the output terminal and another terminal when a current flowing in the branch path is greater than a short circuit detection threshold that is predetermined; and
   a switching circuit configured to switch a current carrying capacity or a configuration of the signal generation circuit to limit a short circuit current flowing in the branch path when the short circuit detection circuit detects the short circuit, wherein
   the short circuit current is set to a value equal to or greater than the short circuit detection threshold and less than a current upper limit value based on a supply capacity of the DC power supply.

2. The signal output device according to claim 1, wherein current upper limit value is an upper limit value of a supplyable current while the DC power supply maintains a predetermined output voltage.

3. The signal output device according to claim 1, wherein the short circuit detection circuit is further configured to detect a current flowing in the current path or a voltage across a load connected to the current path.

4. The signal output device according to claim 3, wherein the short circuit detection circuit is further configured to detect the short circuit based on a filter value from which a high-frequency component of the current or the voltage is removed.

5. The signal output device according to claim 3, wherein the short circuit detection circuit is further configured to detect the short circuit when a time during which the current or the voltage exceeds the short circuit detection threshold continues for a predetermined time or longer.

6. The signal output device according to claim 1, wherein the signal generation circuit has at least one switch element capable of opening and closing the current path in at least one of the upper path and the lower path.

7. The signal output device according to claim 6, wherein when the short circuit is detected, the switching circuit switches the current carrying capacity of the signal generation circuit by decreasing or increasing a gate voltage of the at least one switch element or decreasing a current amount of a current source serving as a reference of the at least one switch element as compared to a normal time.

8. The signal output device according to claim 6, wherein
   the at least one switch element comprises a plurality of switch elements connected in parallel,
   when a short circuit is detected, the switching circuit switches the configuration of the signal generation circuit to reduce the number of switch elements to be turned on among the plurality of switch elements or to energize at least one of the plurality of switch elements having a small on-state current as compared to a normal time.

9. The signal output device according to claim 6, wherein when the short circuit is detected, the switching circuit switches the configuration of the signal generation circuit to connect a resistive element in series to the at least one switch element.

10. The signal output device according to claim 1, wherein
    the signal generation circuit has at least one resistive element in at least one of the upper path and the lower path, and
    when the short circuit is detected, the switching circuit switches the configuration of the signal generation circuit to increase a resistance value of the at least one resistive element through which a current flows as compared to a normal time.

11. The signal output device according to claim 1, wherein the signal generation circuit is further configured to be switchable between a current path that is energized at a normal time and a bypass path that is energized when the short circuit is detected.

12. The signal output device according to claim 1, wherein the short circuit detection circuit is further configured to notify a destination device of the output signal of information that the short circuit is detected by the short circuit detection circuit.

* * * * *